(12) United States Patent
Chen et al.

(10) Patent No.: US 10,742,106 B2
(45) Date of Patent: Aug. 11, 2020

(54) ALTERNATING CURRENT POWER SUPPLY SYSTEM AND STATE MONITORING CIRCUIT FOR THE SAME, AND POWER CONSUMPTION EQUIPMENT

(71) Applicant: SHANGHAI LUMIXESS LIGHTING TECHNOLOGY COMPANY, Shanghai (CN)

(72) Inventors: Zhong Chen, Shanghai (CN); Xin Wu, Shanghai (CN)

(73) Assignee: SHANGHAI LUMIXESS LIGHTING TECHNOLOGY COMPANY, Shanghai (CN)

( * ) Notice: Subject to any disclaimer, the term of this patent is extended or adjusted under 35 U.S.C. 154(b) by 0 days.

(21) Appl. No.: 15/971,403

(22) Filed: May 4, 2018

(65) Prior Publication Data

US 2019/0074758 A1 Mar. 7, 2019

(30) Foreign Application Priority Data

Sep. 7, 2017 (CN) .......................... 2017 1 0802722

(51) Int. Cl.
*H02M 1/00* (2006.01)
*H02M 1/32* (2007.01)
(Continued)

(52) U.S. Cl.
CPC .......... *H02M 1/00* (2013.01); *G01R 19/0092* (2013.01); *G01R 19/165* (2013.01); *G01R 21/00* (2013.01);
(Continued)

(58) Field of Classification Search
CPC .... H02J 3/14; H02H 1/04; H02H 3/40; H02H 3/402; H02H 5/10; H02H 7/12;
(Continued)

(56) References Cited

U.S. PATENT DOCUMENTS 4,261,038 A * 4/1981 Johns ...................... H02H 3/40
324/525
4,357,544 A * 11/1982 May ....................... G01R 31/40
307/34

(Continued)

FOREIGN PATENT DOCUMENTS

JP 07015998 A * 1/1995

OTHER PUBLICATIONS

JP 07015998 Machine English Translation of JP 07015998 Jan. 17, 1995.*

(Continued)

*Primary Examiner* — Thienvu V Tran
*Assistant Examiner* — Sisay G Tiku
(74) *Attorney, Agent, or Firm* — Ohlandt, Greeley, Ruggiero & Perle, LLP

(57) ABSTRACT

An AC power supply system and a state monitoring circuit for the same, and a power consumption equipment are provided. The state monitoring circuit includes: a monitoring circuitry, configured to monitor current state information of the AC power supply system; and a control circuitry, coupled with the monitoring circuitry and configured to identify a current state of the AC power supply system based on the current state information monitored by the monitoring circuitry, and to determine whether to enable an AC power supply to deliver electrical energy to a power consumption equipment. Safety during an AC power supply process may be improved.

23 Claims, 10 Drawing Sheets

(51) Int. Cl.
  *G01R 19/00* (2006.01)
  *G01R 19/165* (2006.01)
  *G01R 21/00* (2006.01)
  *H02J 3/14* (2006.01)
  *H02J 1/00* (2006.01)
  *H02J 3/40* (2006.01)
  *H02H 3/40* (2006.01)
  *H02H 7/22* (2006.01)
  *G01R 31/42* (2006.01)

(52) U.S. Cl.
  CPC .............. *G01R 31/42* (2013.01); *H02M 1/32* (2013.01); *H02M 2001/0003* (2013.01)

(58) Field of Classification Search
  CPC ........ H02H 7/22; H02H 7/226; H02H 7/1203; H02M 1/00; H02M 1/32; H02M 2001/0003; G01R 19/0092; G01R 19/165; G01R 21/00
  See application file for complete search history.

(56) References Cited

U.S. PATENT DOCUMENTS

| | | | | |
|---|---|---|---|---|
| 5,631,569 | A * | 5/1997 | Moore | G01R 19/25 324/133 |
| 9,356,508 | B2 * | 5/2016 | Wang | H02M 3/10 |
| 2007/0145947 | A1 * | 6/2007 | Sakurai | H01M 10/48 320/132 |
| 2010/0202161 | A1 * | 8/2010 | Sims | H02M 7/02 363/20 |
| 2011/0018500 | A1 * | 1/2011 | Takahashi | H02J 7/0052 320/148 |
| 2018/0034373 | A1 * | 2/2018 | Matsuda | H02M 3/28 |
| 2018/0306866 | A1 * | 10/2018 | Tamegai | G01R 31/3648 |
| 2018/0356251 | A1 * | 12/2018 | Kuzmanovic | G01D 5/142 |

OTHER PUBLICATIONS

JP 07015998 Machine English Translation of JP 07015998 (Year: 1995).*

* cited by examiner

ALTERNATING CURRENT POWER SUPPLY SYSTEM AND STATE MONITORING CIRCUIT FOR THE SAME, AND POWER CONSUMPTION EQUIPMENT

CROSS-REFERENCE TO RELATED APPLICATIONS

This application claims the benefit of priority to Chinese Patent Application No. 201710802722.2, filed on Sep. 7, 2017, the entire disclosure of which is incorporated herein by reference.

TECHNICAL FIELD

The present disclosure generally relates to an alternating current (AC) power supply field, and more particularly, to an AC power supply system and a state monitoring circuit for the same, and a power consumption equipment.

BACKGROUND

With development of electricity and electronic technologies as well as improvement in energy saving and environmental protection requirements, more and more power consumption equipment tend to use a drive solution based on high-frequency electricity and electronic conversion technology, to reduce energy consumption of the power consumption equipment and improve power consumption efficiency and reliability of the power consumption equipment.

There are various types of power consumption equipment. For example, the power consumption equipment may be an illuminating bulb, a domestic inverter air conditioner, or a charging pile for electric vehicles. Power of such power consumption equipment is supplied by an AC mains network provided by a power station or a nearby substation.

The substation or AC mains electricity output from the substation is an AC voltage source with very low internal impedance in essence. The AC voltage source is transmitted to an AC distribution box at a user side via an electricity cable for transmission, then goes through an electricity cable and an AC power switch at the user side, and finally is delivered to the power consumption equipment. In embodiments of the present disclosure, apparatuses in a whole AC power supply system except the power consumption equipment are referred to as electrical supplying facilities.

In an entire AC electrical energy delivery process, if power consumption of one or more electrical supplying facilities increases, heat generated by the electrical supplying facilities may be too great. Generated high-temperature heat may melt an insulating material in the electrical supplying facility, and even cause the insulating material in the electrical supplying facility to burn to result in a fire.

In view of the above problems, an existing approach is to use a material with a higher flame retardant grade or an anti-aging and corrosion-resistant material as an electrical insulation component in the electrical supplying facility, and to plate gold or silver at a contact of a conductive metal reed to reduce a contact resistance.

However, with an increase in using years of the electrical supplying facility, the material of the electrical insulation component is gradually aging, and the gold-plated or silver-plated material at the contact of the conductive metal reed may fall off. Therefore, the existing method cannot fundamentally avoid a potential safety hazard during a power consumption procedure.

SUMMARY

Embodiments of the present disclosure may improve safety during an AC power supply process.

In an embodiments, a state monitoring circuit for an AC power supply system is provided, including: a monitoring circuitry, configured to monitor current state information of the AC power supply system; and a control circuitry, coupled with the monitoring circuitry and configured to identify a current state of the AC power supply system based on the current state information monitored by the monitoring circuitry, and to determine whether to enable an AC power supply to deliver electrical energy to a power consumption equipment.

Optionally, the monitored current state information of the AC power supply system includes a total equivalent impedance or a total equivalent admittance of the AC power supply system, wherein the total equivalent impedance is a sum of an equivalent impedance of all electrical supplying facilities in the AC power supply system, and the total equivalent admittance is a sum of an equivalent admittance of all the electrical power facilities in the AC power supply system.

Optionally, the power consumption equipment may include: a rectifier circuit, configured to rectify an AC voltage from the AC power supply into a direct current (DC) voltage; and a power converter stage, coupled with the rectifier circuit, and configured to perform a power conversion based on the DC voltage from the rectifier circuit.

Optionally, the state monitoring circuit may be coupled between the rectifier circuit and the power converter stage.

Optionally, the control circuitry may include: a control circuit, configured to identify the current state of the AC power supply system based on the current state information monitored by the monitoring circuitry, and output a corresponding control signal; a switching circuit, coupled with the control circuit, and configured to receive the corresponding control signal from the control circuit and operate in a conductive or a non-conductive state, so as to deliver or cut-off electrical energy from the AC power supply to the power consumption equipment; and a charging and discharging circuit, connected in series with the switching circuit and coupled with the rectifier circuit, and configured to perform charging when the switching circuit is conductive, and perform discharging when the switching circuit is non-conductive.

Optionally, the monitoring circuitry may include: a first monitoring sub-circuit, coupled with the rectifier circuit, and configured to monitor a voltage value of the electrical supplying facilities in the AC power supply system in a duration when the switching circuit is conductive; and a second monitoring sub-circuit, coupled with the switching circuit, and configured to monitor a current following through the electrical supplying facilities in the AC power supply system.

Optionally, the first monitoring sub-circuit may include: a first sampling resistor, coupled with a positive output terminal of the rectifier circuit; and a second sampling resistor, wherein a first terminal of the second sampling resistor is connected in series with the first sampling resistor, and is coupled with a first input terminal of the control circuit, and a second terminal of the second sampling resistor is coupled with a negative output terminal of the rectifier circuit.

Optionally, the first monitoring sub-circuit may include: a third sampling resistor, coupled with an output terminal of the charging and discharging circuit; and a fourth sampling resistor, wherein a first terminal of the fourth sampling resistor is connected in series with the third sampling resistor, and is coupled with a first input terminal of the control circuit, and a second terminal of the fourth sampling resistor is coupled with a negative output terminal of the rectifier circuit.

Optionally, the first monitoring sub-circuit may include: a fifth sampling resistor, coupled with a first input terminal of the rectifier circuit; and a sixth sampling resistor, wherein a first terminal of the sixth sampling resistor is connected in series with the fifth sampling resistor, and is coupled with a first input terminal of the control circuit, and a second terminal of the sixth sampling resistor is coupled with a negative output terminal of the rectifier circuit.

Optionally, the second monitoring sub-circuit may include: a seventh sampling resistor, wherein a first terminal of the seventh sampling resistor is connected in series with the switching circuit, and is coupled with a second input terminal of the control circuit, and a second terminal of the seventh sampling resistor is coupled with a negative output terminal of the rectifier circuit.

Optionally, the control circuit may include: a synchronization detecting circuit, coupled with the first monitoring sub-circuit and a first reference voltage output terminal, and configured to: when the voltage value monitored by the first monitoring sub-circuit is equal to a first reference voltage value output from the first reference voltage output terminal, output a corresponding signal to control the switching circuit to be conductive within a preset duration; a state judgment circuit, coupled with the first monitoring sub-circuit and the second monitoring sub-circuit, and configured to: during the preset duration when the switching circuit is conductive, determine the current state of the AC power supply system based on monitoring results of the first monitoring sub-circuit and the second monitoring sub-circuit, and output a control signal corresponding to a determination result; and a driver circuit, coupled with the synchronization detecting circuit and the state judgment circuit, and configured to: receive signals from the synchronization detecting circuit and the state judgment circuit, and control the switching circuit to be conductive or non-conductive.

Optionally, the synchronization detecting circuit may include: a synchronization detecting sub-circuit, coupled with the first monitoring sub-circuit and the first reference voltage output terminal, configured to: when the voltage value monitored by the first monitoring sub-circuit is equal to the first reference voltage value output from the first reference voltage output terminal, output a startup signal; and a timer circuit, coupled with the synchronization detecting sub-circuit, configured to: when receiving the startup signal from the synchronization detecting sub-circuit, output a first control signal to control the switching circuit to be conductive within the preset duration, and output a second control signal to control the switching circuit to be non-conductive when the preset duration ends.

Optionally, the timer circuit may be a monostable timer.

Optionally, the state judgment circuit may include: a monitoring result calculation circuit, coupled with the first monitoring sub-circuit and the second monitoring sub-circuit, and configured to: calculate an estimated value which indicates the current state information of the AC power supply system based on the monitoring results of the first monitoring sub-circuit and the second monitoring sub-circuit during the preset duration when the switching circuit is conductive; a monitoring result comparison circuit, coupled with the monitoring result calculation circuit and a second reference voltage output terminal, and configured to: compare the estimated value calculated by the monitoring result calculation circuit with a second reference voltage value output from the second reference voltage output terminal, and output a determination signal which indicates the current state of the AC power supply system; and a logic register, coupled with the monitoring result comparison circuit, and configured to: receive the determination signal from the monitoring result comparison circuit and determine whether to control the switching circuit to enter into a continuous conductive state.

Optionally, the monitoring result calculation circuit may include: a voltage signal acquisition circuit, coupled with the first monitoring sub-circuit, and configured to acquire the voltage monitored by the first monitoring sub-circuit; a current signal acquisition circuit, coupled with the second monitoring sub-circuit, and configured to acquire the current monitored by the second monitoring sub-circuit; and an arithmetic circuit, coupled with the voltage signal acquisition circuit and the current signal acquisition circuit, and configured to receive the voltage from the voltage signal acquisition circuit and the current from the current signal acquisition circuit, and calculate the estimated value which indicates the current state information of the AC power supply system.

Optionally, the arithmetic circuit may be configured to: calculate a ratio of the voltage monitored by the first monitoring sub-circuit to the current monitored by the second monitoring sub-circuit as the estimated value which indicates the current state of AC power supply system.

Optionally, the determination signal may be presented as a first determination signal which indicates the current state of the AC power supply system is normal, if the estimated value is lower than or equal to the second reference voltage value; and the determination signal may be presented as a second determination signal which indicates the current state of the AC power supply system is abnormal, if the estimated value is greater than the second reference voltage value.

Optionally, the driver circuit may be configured to: control the switching circuit to be conductive, when the synchronization detecting circuit outputs the first control signal, or the synchronization detecting circuit outputs the second control signal and the monitoring result comparison circuit outputs the first determination signal; and control the switching circuit to be non-conductive when the synchronization detecting circuit outputs the second control signal and the monitoring result comparison circuit outputs the second determination signal.

Optionally, the driver circuit may include: an OR logic gate, wherein input terminals of the OR logic gate are respectively coupled with the synchronization detecting circuit and the state judgment circuit, an output terminal of the OR logic gate is coupled with the switching circuit, and the OR logic gate is configured to execute an OR logic operation to outputs of the synchronization detecting circuit and the state judgment circuit to obtain a logic result, and send the logic result to the switching circuit to control the switching circuit to be conductive or non-conductive.

Optionally, the driver circuit may further include: a driving buffer, configured to amplify a signal level of the logic result of the OR logic gate and output an amplified logic result to the switching circuit.

Optionally, the control circuit may further include: an enabling circuit, wherein an input terminal of the enabling circuit is coupled with output terminals of the timer circuit and the logic register, an output terminal of the enabling circuit is coupled with the monitoring result calculation circuit and the monitoring result comparison circuit, and the enabling circuit is configured to provide a function enabling signal to the monitoring result calculation circuit and the monitoring result comparison circuit.

Optionally, the enabling circuit may include: an inverter gate, coupled with an output terminal of the logic register; and an AND logic gate, wherein one input terminal of the AND logic gate is coupled with an output terminal of the timer circuit, the other input terminal of the AND logic gate is coupled with an output of the inverter gate, and an output terminal of the AND logic gate outputs the function enabling signal.

Optionally, the charging and discharging circuit may include: a first capacitor, wherein one terminal of the first capacitor is coupled with the rectifier circuit, the other terminal of the first capacitor is coupled with the switching circuit, the first capacitor is connected in parallel with the power converter stage of the power consumption equipment, and configured to perform charging through the switching circuit when the switching circuit is conductive, and to perform discharging through the power converter stage when the switching circuit is non-conductive.

Optionally, the charging and discharging circuit may include: a second capacitor; and a discharging resistor connected in parallel with the second capacitor, wherein one terminal of the second capacitor is coupled with the rectifier circuit, the other terminal of the second capacitor is coupled with the switching circuit, and the second capacitor is configured to perform charging through the switching circuit when the switching circuit is conductive, and perform discharging through the discharging resistor when the switching circuit is non-conductive.

Optionally, the control circuit may further include: an enabling signal output terminal, coupled with an input terminal of the power converter stage, and configured to control the power converter stage to be activated and enter into a normal operation status, based on the current state of the AC power supply system.

Optionally, the state monitoring circuit may be coupled between the power consumption equipment and the electrical supplying facilities in AC power supply system.

In an embodiment, a power consumption equipment is provided, including: a rectifier circuit, configured to rectify an AC voltage of an AC power supply into a DC voltage; a power converter stage, coupled with the rectifier circuit, and configured to perform power conversion based on the DC voltage; and any one of the above state monitoring circuits, coupled between the rectifier circuit and the power converter stage, and configured to identify a current state of the AC power supply system, and to determine whether to enable the AC power supply to deliver electrical energy to the power consumption equipment.

In an embodiment, an AC power supply system is provided, including: an AC supplying apparatus; and an electrical consumption apparatus, coupled with the AC supplying apparatus, wherein the electrical consumption apparatus includes a power consumption equipment, the electrical supplying facilities and any one of the above state monitoring circuits.

Compared with the existing techniques, embodiments of the present disclosure may have following advantages. A monitoring circuitry monitors current state information of an AC power supply system, and a control circuitry identifies a current state of the AC power supply system based on the current state information monitored by the monitoring circuitry, and further to determine whether to enable an AC power supply to deliver electrical energy to a power consumption equipment. In this way, potential safety hazard, such as a high-temperature melt or a fire caused by too great equivalent impedance of electrical power facilities, may be avoided, and further the AC power supply system is protected, which fundamentally improve safety during a power consumption procedure.

Further, by monitoring a sum of an equivalent impedance of all the electrical power facilities in the AC power supply system or a sum of an equivalent admittance of all the electrical power facilities in the AC power supply system, the current state of the AC power supply system may be identified more accurately.

Further, the state monitoring circuit of the AC power supply system is provided between the rectifier circuit and the power converter stage, which is simpler in implementation and lower in cost.

DETAILED DESCRIPTION

Figure 1:
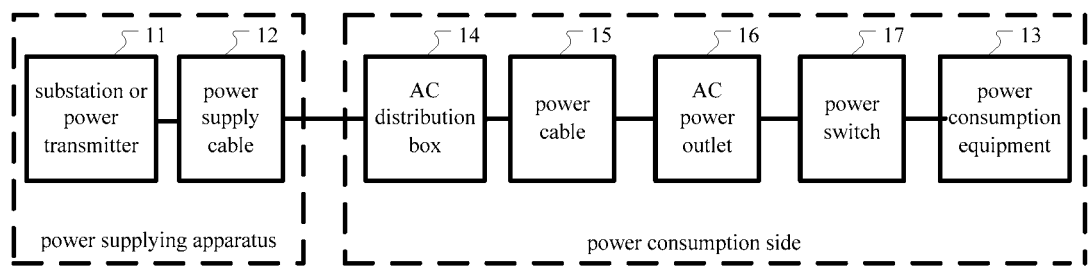
FIG. 1 schematically illustrates a structural diagram of an AC power supply system in the existing techniques.

Due to wide usage of AC power, a large number of current power consumption equipment are powered by an AC electrical network. Referring to FIG. 1, AC electrical energy supplied from a power station goes through a power supplying apparatus composed of a substation or a power transmitter 11 and a power supply cable 12, and is finally delivered to a power consumption equipment 13 at a power consumption side. The power consumption side may include: an AC distribution box 14 at a user side, a power cable 15 at the user side, an AC power outlet 16 at the user side, a power switch 17 and the power consumption equipment 13. In embodiments of the present disclosure, during an entire power delivery process, apparatuses except the power consumption equipment 13 are referred to as electrical power facilities.

In the AC power supply system described above, most electrical power facilities have conductive impedance inherently. For example, at the power supplying apparatus, the power supply cable 12 has an equivalent resistance. At the power consumption side, a wiring pile of the AC distribution box 14 has a contact resistance, the power cable 15 has an equivalent resistance, the AC power outlet 16 has a contact resistance, and the power switch 17 has a contact resistance. In some electrical fields, a wiring nut is commonly used to make short circuits between power cables. Therefore, a contact resistance also exists between power cables.

With an increase in using years, the equivalent resistance or contact resistance corresponding to the electrical power facilities may become greater due to factors such as aging or corrosion.

Figure 2:
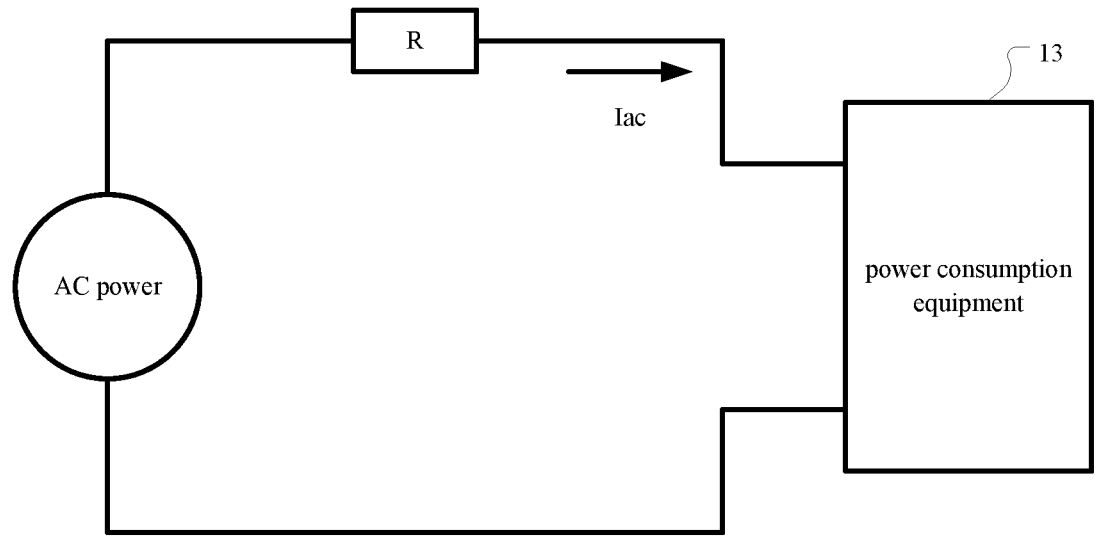
FIG. 2 schematically illustrates a structural diagram of an equivalent circuit of an AC power supply system in the existing techniques.

Referring to FIG. 2, a resistor R represents a sum of the equivalent resistance or contact resistance of the electrical power facilities in the AC power supply system, and can be collectively referred to as a power supply equivalent impedance R.

As can be seen from FIG. 2, the power supply equivalent impedance R is connected in series in a power supply circuit of the power consumption equipment 13. When the power consumption equipment 13 operates, its required operating current Iac also flows through the power supply equivalent impedance R. Therefore, the current Iac can generate power consumption on the power supply equivalent impedance R, and the power consumed by the current Iac is expressed as $P=Iac^2*R$.

The greater the resistance of the power supply equivalent impedance R is, the greater the power P it consumes. When the power supply equivalent impedance R is mainly composed of a partial impedance, for example, if the power supply equivalent impedance R is mainly composed of a contact resistance of a conductive metal reed in an AC power outlet at the user sides, power is mainly consumed by the conductive metal reed, and heat generated correspondingly may cause the conductive metal reed to give off heat.

When the heat is too great, an insulated plastic shell of the AC power outlet may be melt, and a fire accident, such as burning of the insulation plastic shell, may be caused even. Conductive metal parts in the outlet may be exposed if the insulated plastic shell is melt, which results in a failure in insulation. If a user contacts the AC power outlet, there may be an electric shock.

In practice, the equivalent resistance or contact resistance corresponding to any one electrical power facility in the AC power supply system may increase. If the increment occurs on one electrical power facility, its power consumption increases accordingly, and high-temperature heat generated may cause its inner insulated material to burn or result in a failure in insulation for electrical safety.

In view of the above problems, an existing approach is to use a material with a higher flame retardant grade or an anti-aging and corrosion-resistant material as an electrical insulation component in the electrical supplying facility, and to plate gold or silver at a contact of a conductive metal reed to reduce a contact resistance.

However, with an increase in using years of the electrical supplying facility, the material of the electrical insulation component is gradually aging, and the gold-plated or silver-plated material at the contact of the conductive metal reed may fall off. Therefore, the existing method cannot fundamentally avoid a potential safety hazard during a power consumption procedure.

Embodiments of this present disclosure provide a state monitoring circuit for an AC power supply system. A monitoring circuitry monitors current state information of an AC power supply system, and a control circuitry identifies a current state of the AC power supply system based on the current state information monitored by the monitoring circuitry, and further to determine whether to enable an AC power supply to deliver electrical energy to a power consumption equipment. In this way, potential safety hazard, such as a high-temperature melt or a fire caused by too great equivalent impedance of electrical power facilities, may be avoided, and further the AC power supply system is protected, which fundamentally improve safety during a power consumption procedure.

In order to clarify the object, solutions and advantages of embodiments of the present disclosure, embodiments of present disclosure will be described clearly in detail in conjunction with accompanying drawings.

Figure 3:
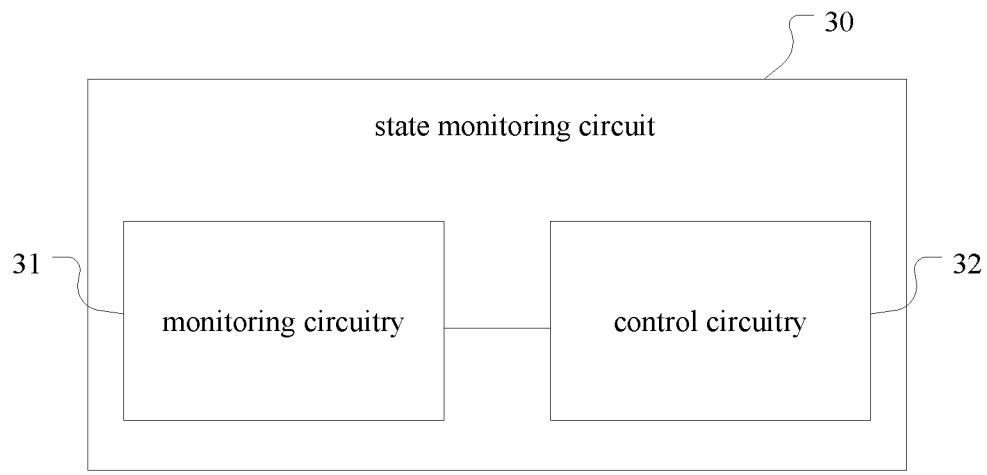
FIG. 3 schematically illustrates a structural diagram of a state monitoring circuit for an AC power supply system according to an embodiment of the present disclosure.

Referring to FIG. 3, a state monitoring circuit 30 for an AC power supply system is provided in an embodiment of the present disclosure. The state monitoring circuit 30 may include a monitoring circuitry 31 and a control circuitry 32.

The monitoring circuitry 31 may be configured to monitor current state information of the AC power supply system; and the control circuitry 32 may be coupled with the monitoring circuitry 31 and configured to identify a current state of the AC power supply system based on the current state information monitored by the monitoring circuitry 31, and to determine whether to enable an AC power supply to deliver electrical energy to a power consumption equipment.

In some embodiments, the monitoring circuitry 31 may monitor multiple types of current state information of the AC power supply system, and the specific types are not limited in embodiments of the present disclosure.

Conductivity of electrical power facilities in the AC power supply system becomes poor always due to an increase in a conduction resistance or a contact resistance. The conduction resistance may become greater due to factors such as aging or corrosion of a power cable in the electrical power facilities. The contact resistance may become greater due to a poor contact of, for example, a mechanical contact of a wiring pile, a power outlet or an electrical switch, or a juncture between wires.

The increase in either the conduction resistance or the contact resistance can enlarge an equivalent impedance of the electrical power facilities in the AC power supply system. Accordingly, an equivalent admittance of the electrical power facilities in the AC power supply system is reduced. Therefore, in some embodiments, to determine a current state of the AC power supply system more accurately, the current state information monitored by the monitoring circuitry 31 may include: a total equivalent impedance or a total equivalent admittance of the AC power supply system.

The total equivalent impedance is a sum of an equivalent impedance of all the electrical supplying facilities in the AC power supply system, and the total equivalent admittance is a sum of an equivalent admittance of all the electrical power facilities in the AC power supply system.

In some embodiments of the present disclosure, the power consumption equipment may be a power load, such as a switching power adaptor, a power inverter, a motor device or an electric heating device.

In some embodiments, a position of the state monitoring circuit 30 in the AC power supply system is not limited.

Figure 4:
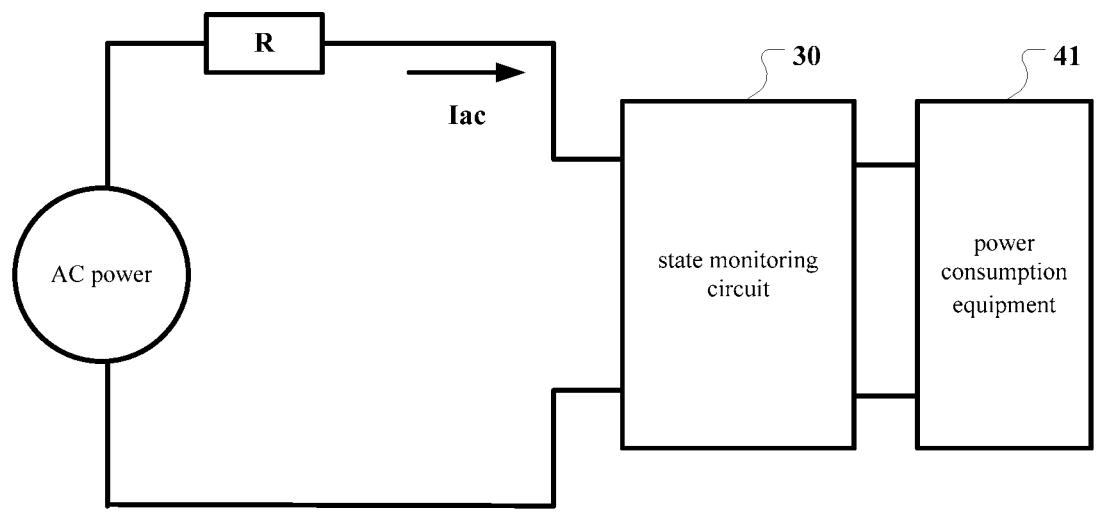
FIG. 4 schematically illustrates a structural diagram of an equivalent circuit of an AC power supply system according to an embodiment of the present disclosure.

Referring to FIG. 4, in some embodiments, the state monitoring circuit 30 may be coupled between the power consumption equipment 41 and the electrical power facilities in the AC power supply system. A resistor R represents a sum of the equivalent resistance or contact resistance of the electrical power facilities in the AC power supply system, and is collectively referred to as the power supply equivalent impedance R. The state monitoring circuit 30 is placed in front of the power consumption equipment 41 to monitor the power supply equivalent impedance R.

Figure 5:
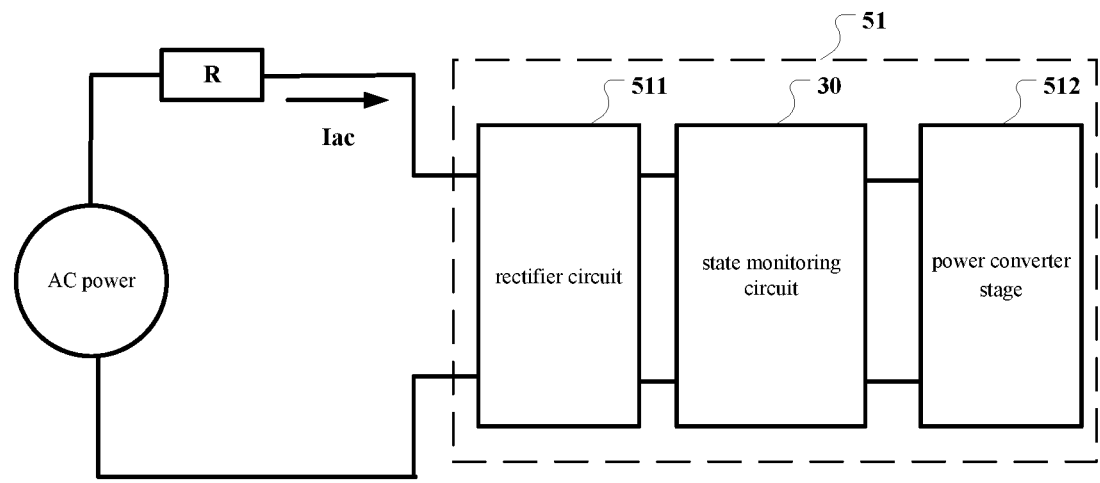
FIG. 5 schematically illustrates a structural diagram of an equivalent circuit of an AC power supply system according to another embodiment of the present disclosure.

In some embodiments, referring to FIG. 5, the power consumption equipment 51 in most cases may include: a rectifier circuit 511, configured to rectify an AC voltage from the AC power supply into a DC voltage; and a power converter stage 512, coupled with the rectifier circuit 511, and configured to perform a power conversion based on the DC voltage from the rectifier circuit. Therefore, the state monitoring circuit 30 may be coupled between the rectifier circuit 511 and the power converter stage 512, which facilitates implementation.

Referring to FIG. 5, after going through the power supply equivalent impedance R of the electrical power facilities, AC power is delivered to the rectifier circuit 511, then passes through the state monitoring circuit 30, and then is delivered to the power converter stage 512. The power supply equivalent impedance R is the sum of the equivalent conductive resistance of the electrical power facilities at front stages. The rectifier circuit 511 is composed of rectifier diodes whose equivalent conductive resistance is small and negligible. Components after the rectifier circuit 511 as well as the rectifier circuit 511 itself can be considered as a power consumption equipment 51. Components in front of the rectifier circuit 511 can be considered as an AC power network which includes the power supply equivalent impedance R of the electrical power facilities.

To a normal AC power network, its voltage changes as a sinusoidal waveform with frequency of 50 Hz or 60 Hz. If the electrical power facilities in the AC power network are normal, for example, if power cables and switch contact are well, the power supply equivalent impedance R of the AC power network is quite small, and the AC power network can be considered as an AC voltage source with a small internal resistance, which provides a sufficiently large AC current for operation of the power converter stage 512. Therefore, the state monitoring circuit 30 mainly monitors whether the power supply equivalent impedance R changes.

It could be understood that the position of the state monitoring circuit 30 is not a limitation factor to embodiments of the present disclosure. No matter where the state monitoring circuit 30 is disposed, the state monitoring circuit 30 is within the scope of the present disclosure.

In following embodiments, the state monitoring circuit 30 is coupled between the rectifier circuit 511 and the power converter stage 512, and the monitoring circuitry 31 monitors the power supply equivalent impedance of the AC power supply system. More details about the state monitoring circuit 30 are described below.

Figure 6:
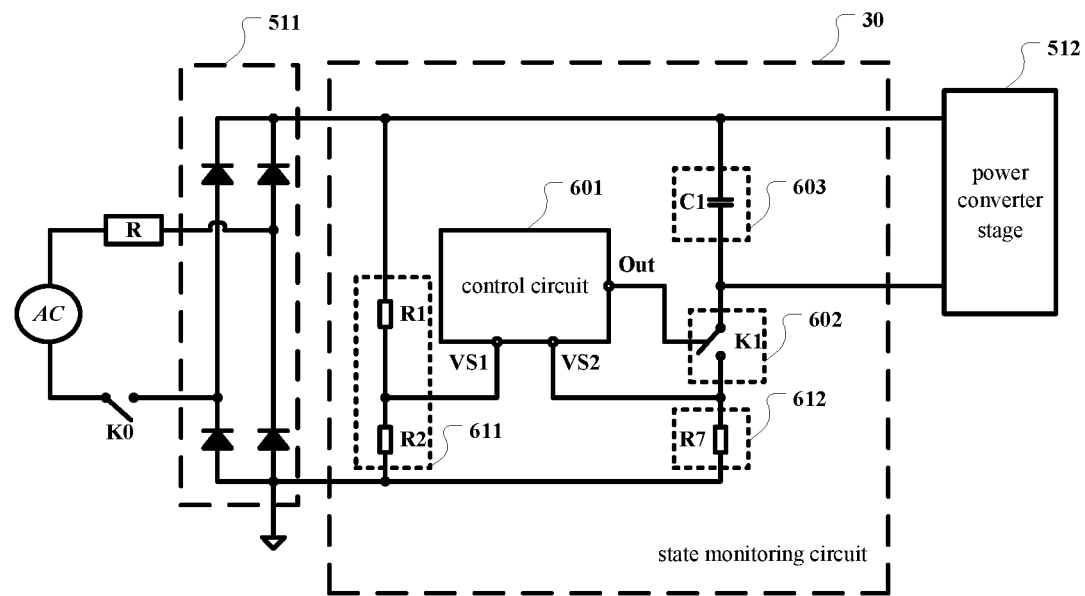
FIG. 6 schematically illustrates a circuit structural diagram of a state monitoring circuit for an AC power supply system according to an embodiment of the present disclosure.

FIG. 6 schematically illustrates a circuit structural diagram of a state monitoring circuit 30 according to an embodiment. Referring to FIG. 6, in some embodiments, the rectifier circuit 511 may consist of four diodes including two groups of two diodes, where the two diodes in each group are connected in series. A positive output terminal and a negative output terminal of the rectifier circuit 511 are coupled with the power converter stage 512 through the state monitoring circuit 30.

In some embodiments, the control circuitry may include a control circuit 601, a switching circuit 602 and a charging and discharging circuit 603.

The control circuit 601 may be configured to identify the current state of the AC power supply system based on the current state information monitored by the monitoring circuitry, and output a corresponding control signal Out. The switching circuit 602 may be coupled with the control circuit 601, and configured to receive the corresponding control signal Out from the control circuit 601 and operate in a conductive or a non-conductive state based on the corresponding control signal Out, so as to deliver or cut-off electrical energy from the AC power supply to the power consumption equipment. The charging and discharging circuit 603 may be connected in series with the switching circuit 602 and coupled with the rectifier circuit 511, and configured to perform charging when the switching circuit 602 is conductive, and perform discharging when the switching circuit 602 is non-conductive.

In some embodiments, the charging and discharging circuit 603 may include: a first capacitor C1, wherein one terminal of the first capacitor C1 is coupled with the rectifier circuit 511, the other terminal of the first capacitor C1 is coupled with the switching circuit 602, the first capacitor is connected in parallel with the power converter stage 512 of the power consumption equipment, and configured to perform charging through the switching circuit 602 when the switching circuit 602 is conductive, and to perform discharging through the power converter stage 512 when the switching circuit 602 is non-conductive.

In some embodiments, the switch circuit 602 may include a first switch K1. The first switch K1 may be a semiconductor solid-state switching device, such as a triode, a field effect transistor or a silicon controlled rectifier.

In some embodiments, the monitoring circuitry may include a first monitoring sub-circuit 611 and a second monitoring sub-circuit 612.

The first monitoring sub-circuit 611 may be coupled with the rectifier circuit 511, and configured to monitor a voltage value of the electrical supplying facilities in the AC power supply system in a duration. The second monitoring sub-circuit 612 may be coupled with the switching circuit 602, and configured to monitor a current following through the electrical supplying facilities in the AC power supply system.

Referring to FIG. 6, in some embodiments, the first monitoring sub-circuit 611 may include a first sampling resistor R1 and a second sampling resistor R2.

The first sampling resistor R1 may be coupled with a positive output terminal of the rectifier circuit 511. A first terminal of the second sampling resistor R2 is connected in series with the first sampling resistor R1, and coupled with a first input terminal of the control circuit 601, and a second terminal of the second sampling resistor R2 is coupled with the negative output terminal of the rectifier circuit 511.

In some embodiments, the second monitoring sub-circuit 612 may include: a seventh sampling resistor R7, wherein a first terminal of the seventh sampling resistor R7 is connected in series with the switching circuit 602, and coupled with a second input terminal of the control circuit 601, and a second terminal of the seventh sampling resistor R7 is coupled with the negative output terminal of the rectifier circuit 511.

Referring to FIG. 6, the AC power supply is delivered to the input terminal of the rectifier circuit 511 via the power supply equivalent impedance R, and the first capacitor C1, the first switch K1 and the seventh sampling resistor R7 are coupled between the positive output terminal and the negative output terminal of the rectifier circuit 511. The current sampled by the seventh sampling resistor R7 is supplied to a signal receiving terminal VS2 of the control circuit 601. The first sampling resistor R1 and the second sampling resistor R2 which are connected in series are coupled between the positive output terminal and the negative output terminal of the rectifier circuit 511, to obtain on the second sampling resistor R2 a voltage sampling signal which is proportional to the voltage output from the rectifier circuit 511. And the voltage sampling signal is supplied to a signal receiving terminal VS1 of the control circuit 601.

The signal receiving terminal VS1 is a first input terminal of the control circuit 601, and the signal receiving terminal VS2 is a second input terminal of the control circuit 601. The power converter stage 512 is connected in parallel with two terminals of the first capacitor C1 to achieve a voltage discharge reset of the first capacitor C1. An output terminal Out of the control circuit 601 is connected to a control terminal of the first switch K1, to control the first switch K1 to be conductive or non-conductive.

Operation principles of the state monitoring circuit 30 are described in detail below with reference to FIG. 6.

When a switch K0 for the AC power supply is conductive, the AC power supply is applied to the input terminal of the rectifier circuit 511 via the power supply equivalent impedance R. In an initial stage, the state monitoring circuit 30 does not start to operate, i.e. the control circuit 601 does not start to operate.

At this time, the output terminal Out of the control circuit 601 may be maintained at a low level, so that the first switch K1 remains in a high impedance state of non-conductive. As the first switch K1 is non-conductive, the first capacitor C1 is not connected in a circuit loop, and a voltage of the first capacitor C1 is zeroed. Even if charges do exist on the first capacitor C1, they are discharged to be zero by impedance of the power converter stage 512 connected in parallel with the first capacitor C1. As the first switch K1 is non-conductive, no current flows through the seventh sampling resistor R7, so that a signal supplied to the signal receiving terminal VS2 of the control circuit 601 is also zero. Besides, at this stage, the voltage output from the rectifier circuit 511 forms divided voltages on the first sampling resistor R1 and the second sampling resistor R2, and a voltage sampling signal VS1 is obtained.

When the control circuit 601 starts to operate, the control circuit 601 detects the voltage sampling signal VS1. As the voltage sampling signal VS1 is generated by dividing the voltage output from the rectifier circuit 511 based on a ratio of resistance of the first sampling resistor R1 to resistance of the second sampling resistor R2, the voltage sampling signal VS1 exhibits a rectified form of a sinusoidal voltage signal. When the voltage sampling signal VS1 reaches a comparison threshold value Vref1 set by the control circuit 601, the control circuit 601 samples the voltage sampling signal VS1, and records and holds the amplitude of the sampled voltage sampling signal VS1 in the control circuit 601. Afterward, the control signal Out output from the control circuit 601 starts to be a high level, so as to cause the first switch K1 to enter a conductive state.

In some embodiments, the control circuit 601 may set a duration during which the control signal Out maintains a high level. For example, the duration may be within a range from several microseconds to several tens of microseconds. When the duration ends, the control signal Out is reset to be a low level, so that the first switch K1 turns to be non-conductive.

During the duration when the control signal Out output from the control circuit 601 outputs a high level to maintain the first switch K1 to be conductive, the AC power supply passes through a current circuit of the power supply equivalent impedance R, the rectifier circuit 511, the first capacitor C1, the first switch K1 and the seventh sampling resistor R7, and starts to charge the first capacitor C1.

The duration when the first switch K1 is conductive is relatively short. As a voltage across a capacitor cannot change drastically, it is concluded that during the short duration, a voltage drop on the first capacitor C1 is relatively small, and the initial voltage across the first capacitor C1 is discharged to be zero by the power converter stage 512. Therefore, voltage variation across the first capacitor C1 in the short duration may be negligible.

In addition, in the duration when the first switch K1 is conductive, a conductive voltage drop of diodes in the rectifier circuit 511 and a voltage drop on the seventh sampling resistor R7 are small and can be negligible as well. Besides, a conductive voltage drop of the first switch K1 is also small and can be negligible. Therefore, in the duration when the first switch K1 is conductive, an instantaneous value of the AC power supply is mainly applied to the power supply equivalent impedance R, so that an instantaneous pulse current is generated on the power supply equivalent impedance R.

A loop where the instantaneous pulse current flows includes the seventh sampling resistor R7. A voltage signal reflecting the instantaneous pulse current may be generated on the seventh sampling resistor R7 and sent to the signal receiving terminal VS2 of the control circuit 601. The control circuit 601 may sample a pulse amplitude of signals output from the signal receiving terminal VS2.

In some embodiments, the first switch K1 may be controlled to be conductive if the amplitude of the voltage sampling signal VS1 reaches a first reference voltage Vref1 set by the control circuit 601. When the amplitude of the voltage sampling signal VS1 is equal to the first reference voltage Vref1, the control circuit 601 records and holds the amplitude of the currently sampled voltage sampling signal VS1. As the duration when the first switch K1 is conductive only lasts several microseconds, in a subsequent duration when the first switch K1 is conductive, the amplitude of the corresponding voltage sampling signal VS1 and the amplitude of the voltage sampling signal VS1 recorded and held in the control circuit 601 are almost the same.

In addition, in the duration when the first switch K1 is conductive, the instantaneous value of the AC power supply is mainly applied across the power supply equivalent impedance R. Therefore, the amplitude of the voltage sampling signal VS1 recorded and held in the control circuit 601 reflects the instantaneous value of the AC power supply applied across the power supply equivalent impedance R during the duration when the first switch K1 is conductive, where a proportional relation therebetween depends on the first sampling resistor R1, the second sampling resistor R2 and the first reference voltage Vref1. Resistance of the first sampling resistor R1 and the second sampling resistor R2, and a value of the first reference voltage Vref1 may be constant.

Based on the above descriptions, following equations may be obtained.

At a sampling time, the VS1 value recorded in the control circuitry is represented as VS1=Vref1.

At the sampling time, the VS1 value outside of the control circuitry is represented as VS1=Vac*R2/(R1+R2), where Vac represents the instantaneous value of AC power supply at the sampling time.

During the duration when the first switch K1 is conductive, the instantaneous value Vac of the AC power supply is almost applied across the power supply equivalent impedance R. Thus, during the conductive period of the first switch K1, the instantaneous voltage value V_R across the power supply equivalent impedance R can be represented as:

$$V\_R=Vac=Vref1*(1+R1/R2) \qquad (1)$$

In addition, during the duration when the first switch K1 is conductive, an instantaneous pulse current flows through the power supply equivalent impedance R, and the seventh sampling resistor R7. A signal obtained on the seventh sampling resistor R7 is supplied to the signal receiving terminal VS2 of the control circuit 601, and the control circuit 601 samples the pulse amplitude of the signal obtained at the signal receiving terminal VS2. Therefore, the pulse amplitude of the signal obtained at the signal receiving terminal VS2 is proportional to the amplitude of the pulse current flowing through the power supply equivalent impedance R, where a ratio depends on the resistance of the seventh sampling resistor R7.

Assuming that the amplitude of the pulse current flowing through the power supply equivalent impedance R is I_R and the pulse signal amplitude on the seventh sampling resistor R7 sampled by the control circuit 601 is VS2, the following equation can be obtained:

$$I\_R=VS2/R7 \qquad (2).$$

From the equations (1) and (2), the resistance of the power supply equivalent impedance R can be represented as:

$$R=V\_R/I\_R \qquad (3).$$

Based on the equations (1), (2) and (3), the power supply equivalent impedance R can be further represented as:

$$R = Vref1*(1 + R1/R2)/(VS2/R7) = \qquad (4)$$
$$VS1*(1 + R1/R2)/(VS2/R7) = (VS1/VS2)*R7*(1 + R1/R2).$$

As the first reference voltage Vref1 is a constant value in the control circuit 601 and the resistance of the resistors R1, R2 and R7 are also known, the control circuit 601 may indirectly measure the power supply equivalent impedance R based on a short-time conduction and sampling of the amplitude of the signal obtained at the signal receiving terminal VS2.

In some embodiments, the control circuit 601 may take a ratio of VS1 to VS2 (i.e., VS1/VS2) as an estimated value of the power supply equivalent impedance R, compare the estimated value with a preset second reference voltage Vref2, and make a timing control strategy on conduction and non-conduction of the first switch K1 based on a comparison result.

Specifically, VS1/VS2 is compared with Vref2 to obtain the following formulas.

$$VS1/VS2 \leq = Vref2 \text{ or } VS1/VS2 > Vref2.$$

When VS1/VS2<=Vref2, it indicates that the equivalent impedance of the current AC power supply system is small. The control circuit 601 may determine that the current AC power supply system is normal, and control the first switch K1 to keep conductive after the duration when the first switch K1 is conductive ends. Therefore, the voltage output from the rectifier circuit 511 is supplied to the power converter stage 512 due to continuous conduction of the first switch K1, so that the power converter stage 512 is supplied with power and start to operate. In other words, if detecting that the equivalent impedance of the AC power supply system is relatively small, the state monitoring circuit 30 determines the AC power supply system to be normal, and controls the first switch K1 to be conductive continuously, so as to enable the power converter stage 512. In this way, the power consumption equipment operates normally.

When VS1/VS2>Vref2, it indicates that the equivalent impedance of the current AC power supply system is relatively high. The control circuit 601 may determine that the current AC power supply system is abnormal, and control the first switch K1 to be non-conductive immediately after the duration when the first switch K1 is conductive ends. Therefore, the voltage output from the rectifier circuit 511 cannot be supplied to the power converter stage 512, and the power converter stage 512 cannot operate because of lacking power. In other words, if detecting that the equivalent impedance of the AC power supply system is relatively high, the state monitoring circuit 30 determines the AC power supply system to be abnormal, and controls the first switch K1 to be non-conductive. The power converter stage 512 cannot continue operating because of losing power. Therefore, the power consumption equipment is prohibited from running.

When the power converter stage 512 does not operate, a large current required for operation is not generated, and a situation shown in FIG. 5 where the AC current Iac is relatively large may not occur. Accordingly, power consumption may not be generated on the power supply equivalent impedance R. In this way, even if an electrical power facility in the AC power supply system has a great abnormal impedance, power consumption generated on the great abnormal impedance is relatively small as the AC current Iac is small. Therefore, accidents such as high-temperature melting or burning may not be caused.

It could be understood that, in some embodiments, when the control circuit 601 controls the first switch K1 to be non-conductive as VS1/VS2>Vref2, the control operation is not permanent. The control circuit 601 may restart sampling signals at the signal receiving terminals VS1 and VS2 when a next AC voltage period comes, to start a next measurement of the power supply equivalent impedance R. As long as VS1/VS2>Vref2, the above procedure of conduction, measurement, determination and non-conduction may be performed periodically. Only when VS1/VS2<=Vref2, the control circuit 601 determines that the current AC power supply system is normal, and continues controlling the first switch K1 to be conductive after the duration when the first switch K1 is conductive ends, so that the power converter stage 512 operates continuously.

Figure 7:
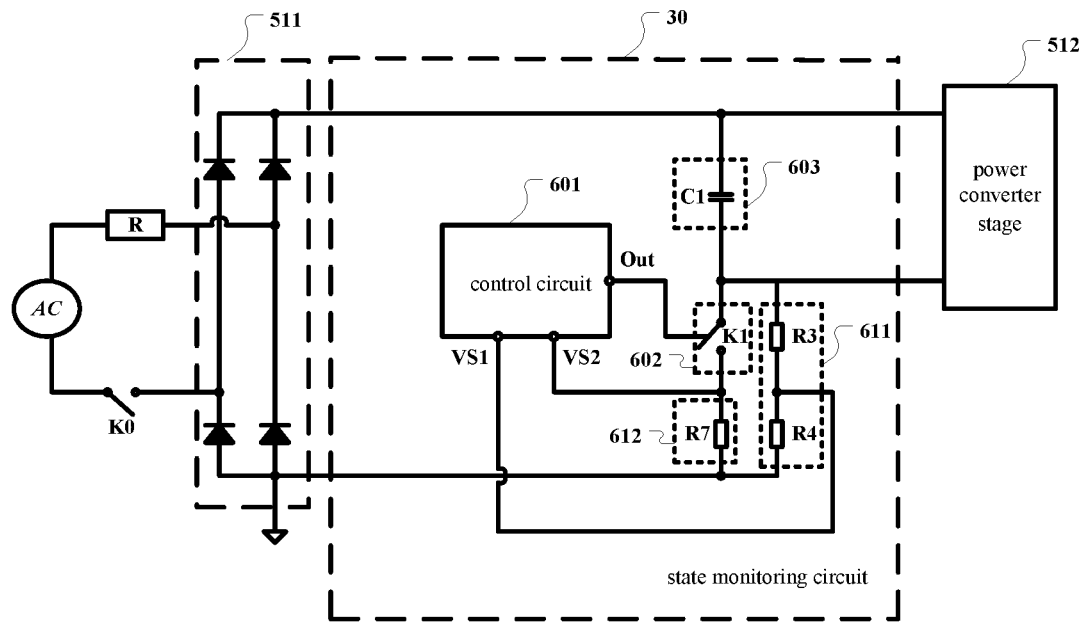
FIG. 7 schematically illustrates a circuit structural diagram of a state monitoring circuit for an AC power supply system according to another embodiment of the present disclosure.

FIG. 7 schematically illustrates a circuit structural diagram of a state monitoring circuit 30 in another embodiment. Referring to FIG. 7, a difference between the state monitoring circuit 30 in FIG. 7 and that in FIG. 6 lies in that: the first monitoring sub-circuit 611 includes a third sampling resistor R3 and a fourth sampling resistor R4.

The third sampling resistor R3 is coupled with an output terminal of the charging and discharging circuit 603. A first terminal of the fourth sampling resistor R4 is connected in series with the third sampling resistor R3, and coupled with the first input terminal (i.e., the signal receiving terminal VS1) of the control circuit 601, and a second terminal of the fourth sampling resistor R4 is coupled with the negative output terminal of the rectifier circuit 511.

Referring to FIG. 7, the third sampling resistor R3 and the fourth sampling resistor R4 which generate the voltage sampling signal VS1 are coupled between one terminal of the first switch K1 and the negative output terminal of the rectifier circuit 511. Resistance of the third sampling resistor R3 and the fourth sampling resistor R4 may be much greater than equivalent resistance of the power converter stage 512. An initial voltage on the first capacitor C1 is no longer zero, and it is a static DC divided voltage value determined by the equivalent resistance of the power converter stage 512 and the resistances of the third sampling resistor R3 and the fourth sampling resistor R4. Therefore, the voltage sampling signal VS1 is obtained based on the following equation: $VS1=(Vac-Vcl)*R4/(R3+R4)$, where Vac is the voltage output from the rectifier circuit 511, and Vcl is the static DC divided voltage value of the first capacitor C1. More information can be derived in the above descriptions about working principles of the state monitoring circuit 30 in FIG. 6, and are not described in detail here.

Figure 8:
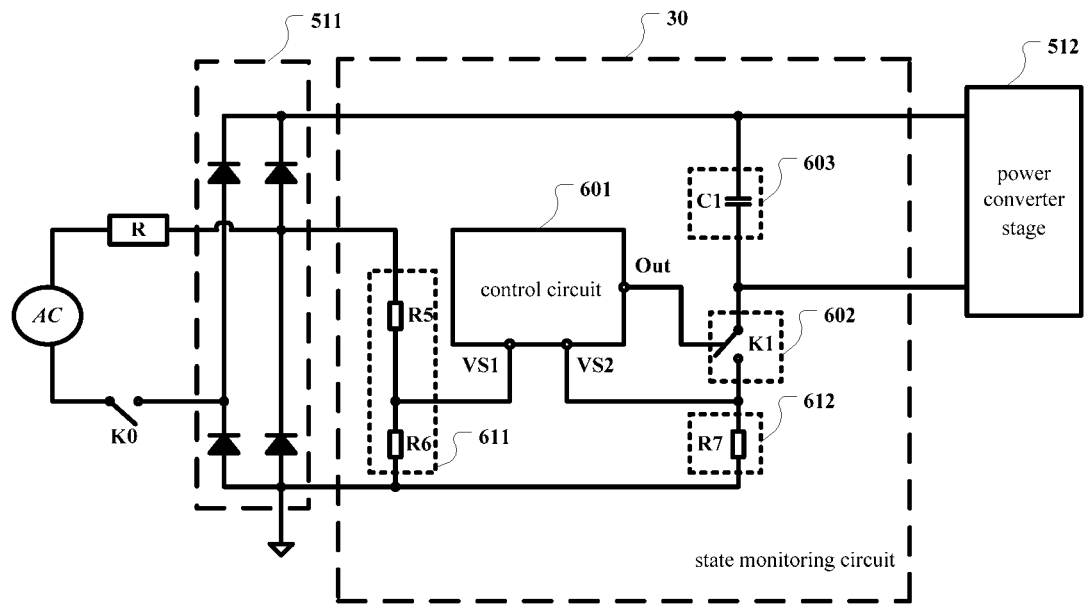
FIG. 8 schematically illustrates a circuit structural diagram of a state monitoring circuit for an AC power supply system according to another embodiment of the present disclosure.

FIG. 8 schematically illustrates a circuit structural diagram of a state monitoring circuit 30 in another embodiment. Referring to FIG. 8, a difference between the state monitoring circuit 30 in FIG. 8 and that in FIG. 6 lies in that: the first monitoring sub-circuit 611 includes a fifth sampling resistor R5 and a sixth sampling resistor R6.

The fifth sampling resistor R5 may be coupled with the first input terminal of the rectifier circuit 511. A first terminal of the sixth sampling resistor R6 is connected in series with the fifth sampling resistor R5, and coupled with the first input terminal (i.e., the signal receiving terminal VS1) of the control circuit 601, and a second terminal of the sixth sampling resistor R6 is coupled with the negative output terminal of the rectifier circuit 511.

Referring to FIG. 8, the fifth sampling resistor R5 and the sixth sampling resistor R6 which generate the voltage sampling signal VS1 are coupled between one input terminal of the rectifier circuit 511 and the negative output terminal of the rectifier circuit 511. That is, the voltage sampling signal VS1 is generated from one bridge arm of a rectifier bridge in the rectifier circuit 511, where a voltage on the bridge arm appears as a half-cycle of an AC sinusoidal voltage. Accordingly, the voltage sampling signal VS1 also appears as a half-cycle of the AC sinusoidal voltage. The sampling, recording and holding of the voltage sampling signal VS1 by the control circuit 601 may be similar to the descriptions of the above embodiments, and frequency of the measurement of the power supply equivalent impedance in the AC power supply system by the control circuit 601 may be reduced to a half of that in the embodiment shown in FIG. 6. More information can be derived in the above descriptions about working principles of the state monitoring circuit 30 in FIG. 6, and are not described in detail here.

Figure 9:
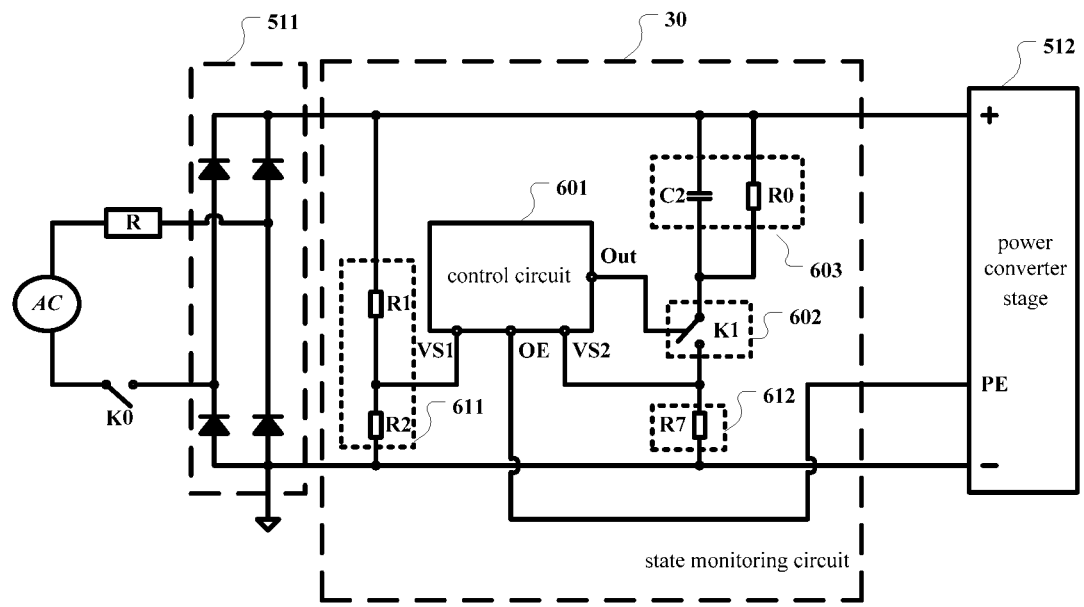
FIG. 9 schematically illustrates a circuit structural diagram of a state monitoring circuit for an AC power supply system according to another embodiment of the present disclosure.

FIG. 9 schematically illustrates a circuit structural diagram of a state monitoring circuit 30 in another embodiment. Referring to FIG. 9, a difference between the state monitoring circuit 30 in FIG. 9 and that in FIG. 6 lies in that: the charging and discharging circuit 602 includes a second capacitor C2 and a discharging resistor R0 connected in parallel with the second capacitor C2.

One terminal of the second capacitor C2 is coupled with the rectifier circuit 511, the other terminal of the second capacitor C2 is coupled with the switching circuit 602, and the second capacitor C2 is configured to perform charging through the switching circuit 602 when the switching circuit 602 is conductive, and perform discharging through the discharging resistor R0 when the switching circuit 602 is non-conductive.

The control circuit 601 may further include an enabling signal output terminal OE which is coupled with an input terminal of the power converter stage 512 and configured to control the power converter stage 512 to be activated and enter into a normal operation status based on the current state of the AC power supply system.

Referring to FIG. 9, an enabling signal OE output from the enabling signal output terminal OE of the control circuit 601 may be sent to a power stage enabling terminal PE of the power converter stage 512. When the enabling signal OE has an effective level, such as a high level, the power stage enabling terminal PE of the power converter stage 512 may have an effective level accordingly, so as to allow the power converter stage 512 to operate. When the enabling signal OE has an ineffective level, such as a low level, the power stage enabling terminal PE of the power converter stage 512 may have an ineffective level accordingly, so as to prevent the power converter stage 512 from operating.

Circuit structures of the state monitoring circuit 30 are not limited to the above embodiments, and those skilled in the art may employ other circuit structures to implement the state monitoring circuit 30, which are not described in detail here.

In some embodiments, the control circuit 601 may be implemented by different circuit structures which are not limited.

Figure 10:
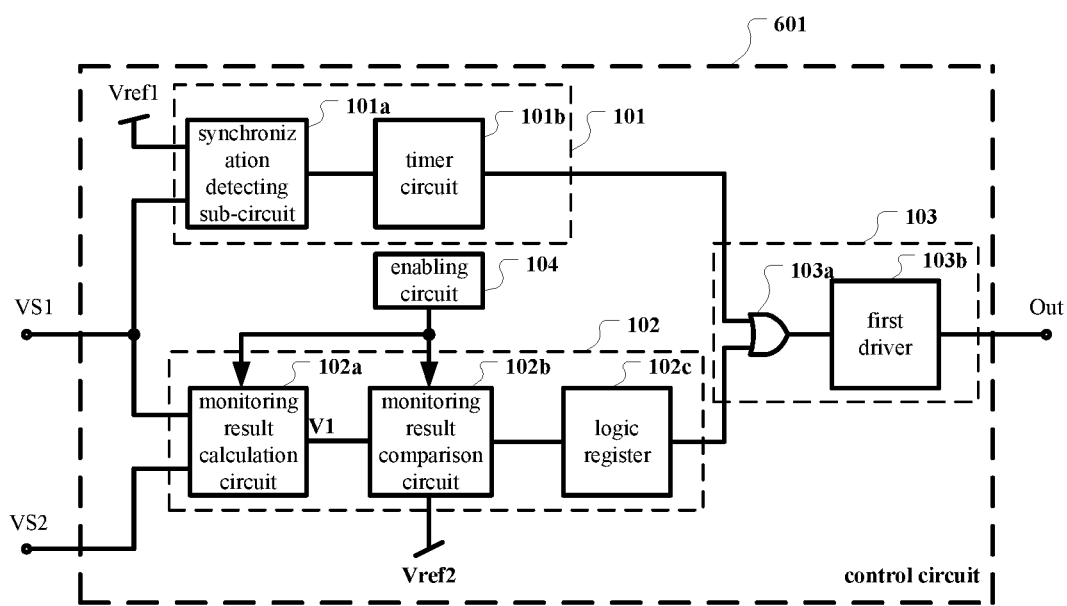
FIG. 10 schematically illustrates a circuit structural diagram of a control circuit according to an embodiment of the present disclosure.

In some embodiments, referring to FIG. 10, the control circuit 601 may include a synchronization detecting circuit 101, a state judgment circuit 102 and a driver circuit 103.

The synchronization detecting circuit 101 may be coupled with the first monitoring sub-circuit and a first reference voltage output terminal, and configured to: when the voltage value VS1 monitored by the first monitoring sub-circuit is equal to a first reference voltage value Vref1 output from the first reference voltage output terminal, output a corresponding signal to control the switching circuit to be conductive within a preset duration.

The state judgment circuit 102 may be coupled with the first monitoring sub-circuit and the second monitoring sub-circuit, and configured to: during the preset duration when the switching circuit is conductive, determine the current state of the AC power supply system based on monitoring results VS1 and VS2 of the first monitoring sub-circuit and the second monitoring sub-circuit, and output a control signal corresponding to a determination result.

The driver circuit 103 may be coupled with the synchronization detecting circuit 101 and the state judgment circuit 102, and configured to: receive signals from the synchronization detecting circuit 101 and the state judgment circuit 102, and control the switching circuit to be conductive or non-conductive based on the received signals.

In some embodiments, the synchronization detecting circuit 101 may include a synchronization detecting sub-circuit 101a and a timer circuit 101b.

The synchronization detecting sub-circuit 101a may be coupled with the first monitoring sub-circuit and the first reference voltage output terminal, configured to: when the voltage value VS1 monitored by the first monitoring sub-circuit is equal to the first reference voltage value Vref1 output from the first reference voltage output terminal, output a startup signal.

The timer circuit 101b may be coupled with the synchronization detecting sub-circuit 101a, and configured to: when receiving the startup signal from the synchronization detecting sub-circuit 101a, output a first control signal to control the switching circuit to be conductive within the preset duration, and output a second control signal to control the switching circuit to be non-conductive when the preset duration ends.

In some embodiments, the timer circuit 101b may be a monostable timer. In other embodiments, the timer circuit 101b may be implemented by other circuits.

In some embodiments, the state judgment circuit 102 may include: a monitoring result calculation circuit 102a, a monitoring result comparison circuit 102b and a logic register 102c.

The monitoring result calculation circuit 102a may be coupled with the first monitoring sub-circuit and the second monitoring sub-circuit, and configured to: calculate an estimated value V1 which indicates the current state information of the AC power supply system based on the monitoring results VS1 and VS2 of the first monitoring sub-circuit and the second monitoring sub-circuit during the preset duration when the switching circuit is conductive.

The monitoring result comparison circuit 102b may be coupled with the monitoring result calculation circuit and a second reference voltage output terminal, and configured to: compare the estimated value calculated by the monitoring result calculation circuit 102a with a second reference voltage value output from the second reference voltage output terminal, and output a determination signal which indicates the current state of the AC power supply system.

The logic register 102c may be coupled with the monitoring result comparison circuit 102b, and configured to: receive the determination signal from the monitoring result comparison circuit 102b and determine whether to control the switching circuit to enter into a continuous conductive state.

In some embodiments, the determination signal is presented as a first determination signal which indicates the current state of the AC power supply system is normal, if the estimated value V1 is lower than or equal to the second reference voltage value Vref2; and the determination signal is presented as a second determination signal which indicates the current state of the AC power supply system is abnormal, if the estimated value V1 is greater than the second reference voltage value Vref2.

In some embodiments, the driver circuit 103 may include an OR logic gate 103a, wherein input terminals of the OR logic gate 103a are respectively coupled with the synchronization detecting circuit 101 and the state judgment circuit 102, an output terminal of the OR logic gate 103a is coupled with the switching circuit, and the OR logic gate 103a is configured to execute an OR logic operation to outputs of the synchronization detecting circuit 101 and the state judgment circuit 102 to obtain a logic result, and send the logic result to the switching circuit to control the switching circuit to be conductive or non-conductive.

In some embodiments, besides the OR logic gate 103a, the driver circuit 103 may further include a driving buffer 103b, configured to amplify a signal level of the logic result of the OR logic gate 103a and output an amplified logic result to the switching circuit.

It could be understood that, in some embodiments, if the logic result of the OR logic gate 103a is great enough to drive the switching circuit, the driver circuit 103 may not include the driving buffer 103b.

In some embodiments, to control starting operation moments of the monitoring result calculation circuit 102a and the monitoring result comparison circuit 102b more accurately, the control circuit 601 may further include: an enabling circuit 104, where an input terminal of the enabling circuit 104 is coupled with output terminals of the timer circuit 101b and the logic register 102c, an output terminal of the enabling circuit 104 is coupled with the monitoring result calculation circuit 102a and the monitoring result comparison circuit 102b, and the enabling circuit 104 is configured to provide a function enabling signal to the monitoring result calculation circuit 102a and the monitoring result comparison circuit 102b.

In some embodiments, the monitoring result calculation circuit 102a and the monitoring result comparison circuit 102b may start up automatically under a particular condition, where the enabling circuit 104 is not required in the control circuit 601, which can simplify complexity of the control circuit 601 and save an area of circuits.

Referring to FIG. 10, the control circuit 601 includes two signal input terminals VS1 and VS2 and a control output terminal Out. The voltage sampling signal VS1 is supplied to one input terminal of the synchronous detecting circuit 101, the first reference voltage Vref1 is supplied to the other input terminal of the synchronous detecting circuit 101 to be compared with the voltage sampling signal VS1. The output of the synchronization detecting circuit 101 is supplied to a start-up terminal of the timer circuit 101b. The voltage sampling signal VS1 is also supplied to one input terminal of the monitoring result calculation circuit 102a, and the current sampling signal VS2 is supplied to the other input terminal of the monitoring result calculation circuit 102a.

The output of the monitoring result calculation circuit 102a is supplied to one input terminal of the monitoring result comparison circuit 102b, and the second reference voltage Vref2 is supplied to the other input terminal of the monitoring result comparison circuit 102b to be compared with the output of the monitoring result calculation circuit 102a. The output of the monitoring result comparison circuit 102b is supplied to an input terminal of the logic register 102c, the output of the logic register 102c is supplied to one input terminal of the OR logic gate 103a, and the output of the timer circuit 101b is supplied to the other input terminal of the OR logic gate 103a, the output of the OR logic gate 103a is supplied to the input terminal of the driving buffer 103b, and the output of the driving buffer 103b serves as the output Out of the entire control circuit. Each of the monitoring result calculation circuit 102a and the monitoring result comparison circuit 102b has an enabling signal input terminal which is coupled with the output terminal of the enabling circuit 104.

Working principles of the control circuit 601 are described below in conjunction with FIGS. 6 and 10.

As a divided voltage of the AC voltage generated by the first sampling resistor R1 and the second sampling resistor R2, the voltage sampling signal VS1 appears as a sinusoidal waveform. With variation of the voltage sampling signal VS1, when reaching the first reference voltage Vref1, the voltage sampling signal VS1 can be identified by the synchronization detecting sub-circuit 101a. The synchronization detecting sub-circuit 101a starts to activate the timer circuit 101b to output a high-level signal with a duration set by the timer circuit 101b. When the duration set by the timer circuit 101b ends, the output of the timer circuit 101b changes to a low level. The timer circuit 101b waits for a next activation.

The high-level signal output by the timer circuit 101b is supplied to the driving buffer 103b via the OR logic gate 103a, so that the output Out of the driving R1 buffer 103b is a high level to enable the first switch K1 to be conductive. Duration of the high-level signal output by the timer circuit 101b determines a conductive time of the first switch K1.

When the first switch K1 is conductive, the AC voltage starts to charge the first capacitor C1 to generate the current sampling signal VS2 on the seventh sampling resistor R7. Besides, the enabling circuit 104 outputs the function enabling signal to activate the monitoring result calculation circuit 102a and the monitoring result comparison circuit 102b.

At a rising edge of the high-level signal output from the timer circuit 101b, the instantaneous value of the voltage sampling signal VS1 is sampled, recorded and held by the monitoring result calculation circuit 102a. Besides, during the duration when the first switch K1 is conductive, the current sampling signal VS2 is sampled continuously and sent to the monitoring result calculation circuit 102a.

The monitoring result calculating circuit 102a calculates the estimated value V1 of the power supply equivalent impedance R in the AC power supply system within the duration based on the currently recorded value of VS1 and the current value of VS2, where V1=VS1/VS2, and outputs the estimated value V1 to the monitoring result comparison circuit 102b.

The monitoring result comparison circuit 102b compares the estimated value V1 with the second reference voltage Vref2.

When V1>Vref2, it indicates that the power supply equivalent impedance of the AC power supply system is relatively great, and it is determined that the current AC power supply system is abnormal.

In some embodiments, the logic register 102c is capable of being activated by a high level. When V1>Vref2, the monitoring result comparison circuit 102b may output a low-level signal to the logic register 102c. The logic register 102c cannot be activated by the low-level signal, and the output of the logic register 102c remains a low level. Transmission of the low-level signal from the logic register 102c to the OR logic gate 103a does not affect the output of the driving buffer 103b.

When the duration set by the timer circuit 101b ends, the high-level signal is reset to be the low-level signal. Accordingly, the output of the OR logic gate 103a changes to the low level, and further the output Out of the driving buffer 103b also changes to the low level. Therefore, the first switch K1 turns to be non-conductive, and the conductive duration of the first switch K1 ends. Further, the enabling circuit 104 disables operation of the monitoring result calculation circuit 102a and the monitoring result comparison circuit 102b. The synchronization detecting sub-circuit 101a waits for the amplitude of the voltage sampling signal VS1 reaching the first reference voltage Vref1 next time and then starts the next identification.

In the above repeated measurement process for the power supply equivalent impedance, when V1<=Vref2, the monitoring result comparison circuit 102b may determine that the power supply equivalent impedance R in the current AC power supply system is normal. At this time, the output of the monitoring result comparison circuit 102b is high-level. The high-level signal is supplied to the logic register 102c, which triggers the logic register 102c to output a high-level signal and sent to the OR logic gate 103a. This further makes the output Out of the driving buffer 103b retain a high level. In this case, even if the duration set by the timer circuit 101b ends, and the enabling circuit 104 disables the operation of the monitoring result calculation circuit 102a and the monitoring result comparison circuit 102b, the output Out of the driving buffer 103b can still retain the high level, which controls the first switch K1 to be conductive continuously. That is, when the control circuit 601 determines that the current AC power supply system is normal, the first switch K1 may be kept in conduction, and the power converter stage 512 is provided with power and starts to operate normally.

Figure 11:
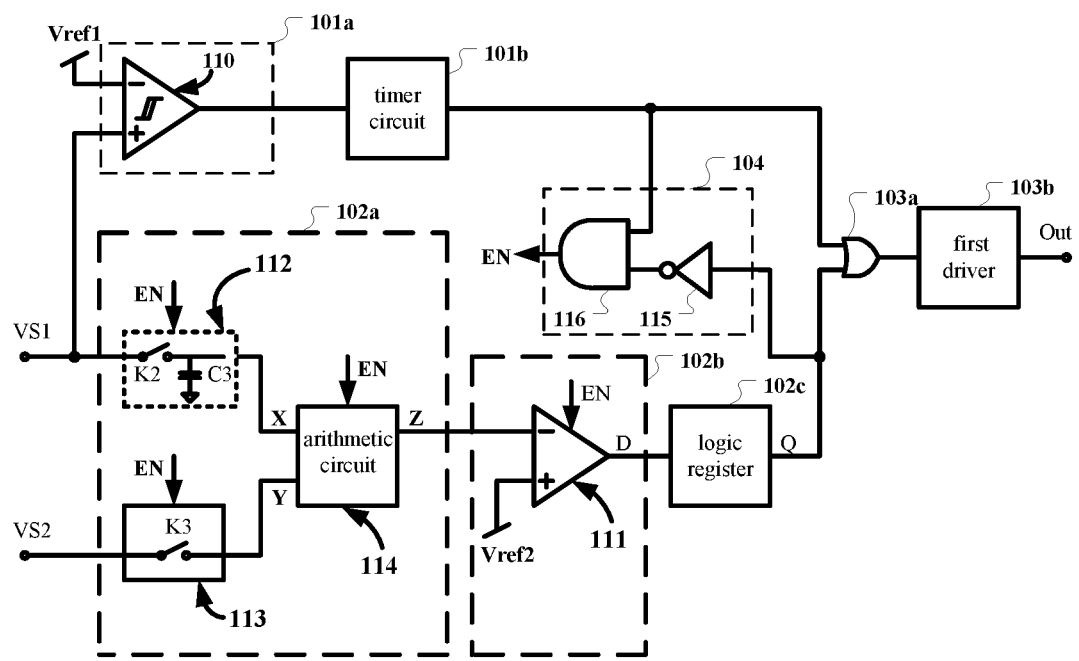
FIG. 11 schematically illustrates a circuit structural diagram of a control circuit according to another embodiment of the present disclosure.

FIG. 11 schematically illustrates a circuit structural diagram of a control circuit 601 according to another embodiment of this present disclosure.

Referring to FIG. 11, in some embodiments, the synchronization detecting sub-circuit 101a may be a first comparator 110 with hysteresis characteristic. The timer circuit 101b may be a monostable timer. The logic register 102c may be a trigger logic register. The monitoring result comparison circuit 102b may be a second comparator 111.

In some embodiments, the monitoring result calculation circuit 102a may include a voltage signal acquisition circuit 112, a current signal acquisition circuit 113 and an arithmetic circuit 114.

The voltage signal acquisition circuit 112 may be coupled with the first monitoring sub-circuit, and configured to acquire the voltage monitored by the first monitoring sub-circuit.

The current signal acquisition circuit 113 may be coupled with the second monitoring sub-circuit, and configured to acquire the current monitored by the second monitoring sub-circuit; and The arithmetic circuit 114 may be coupled with the voltage signal acquisition circuit and the current signal acquisition circuit, and configured to receive the voltage VS1 from the voltage signal acquisition circuit and the current VS2 from the current signal acquisition circuit, and calculate the estimated value V1 which indicates the current state information of the AC power supply system.

In some embodiments, the voltage signal acquisition circuit 112 may include a second switch K2 and a third capacitor C3 coupled with the second switch K2. The current signal acquisition circuit 113 may include a third switch K3.

In some embodiments, the arithmetic circuit 114 may be a divider. The divider may be configured to calculate a ratio (i.e., VS1/VS2) of the voltage monitored by the first monitoring sub-circuit to the current monitored by the second monitoring sub-circuit as the estimated value V1 which indicates the current state of AC power supply system.

In some embodiments, the enabling circuit 104 may include: an inverter gate 115, coupled with the output terminal of the logic register 102c; and an AND logic gate 116, wherein one input terminal of the AND logic gate 116 is coupled with the output terminal of the timer circuit 101b, the other input terminal of the AND logic gate 116 is coupled with an output terminal of the inverter gate 115, and an output terminal of the AND logic gate 116 outputs the function enabling signal.

Referring to FIG. 11, the monitoring result calculation circuit 102a includes a voltage signal acquisition circuit 112, a current signal acquisition circuit 113 and an arithmetic circuit 114. The voltage sampling signal VS1 is supplied to an input terminal of the voltage signal acquisition circuit 112, and the current sampling signal VS2 is supplied to an input terminal of the current signal acquisition circuit 113. An output signal X of the voltage signal acquisition circuit 112 is supplied to one input terminal of the arithmetic circuit 114, and an output signal Y of the current signal acquisition circuit 113 is supplied to the other input terminal of the arithmetic circuit 114. The arithmetic circuit 114 implements a division operation between the amplitude of the signals X and Y, and a result of the division operation serves as an output signal Z of the monitoring result calculation circuit 102a. The signal Z reflects the power supply equivalent impedance in the AC power supply system measured by the control circuit.

The signal Z is supplied to one input terminal of the second comparator 111, the second reference voltage Vref2 is supplied to the other input terminal of the second comparator 111, and an output signal D of the second comparator 111 is the output of the monitoring result comparison circuit 102b.

The signal D is supplied to an input trigger terminal of the trigger logic register 102c, an output signal Q of the trigger logic register 102c is supplied to an input terminal of the OR logic gate 103a, the output signal of the timer circuit 101b is supplied to the other input terminal of the OR logic gate 103a, the output signal of the OR logic gate 103a is supplied to the input terminal of the driving buffer 103b, and the output Out of the driving buffer 103b serves as the output of the entire control circuit.

The signal Q is supplied to one input terminal of the AND logic gate 116 via the inverter gate 115, the output signal of the timer circuit 101b is supplied to the other input terminal of the AND logic gate 116, and the output signal EN of the AND logic gate 116 serves as an output signal of the enabling circuit 104 and is supplied to enabling terminals of the voltage signal acquisition circuit 112, the current signal acquisition circuit 113, the arithmetic circuit 114 and the second comparator 111, respectively.

Figure 12:
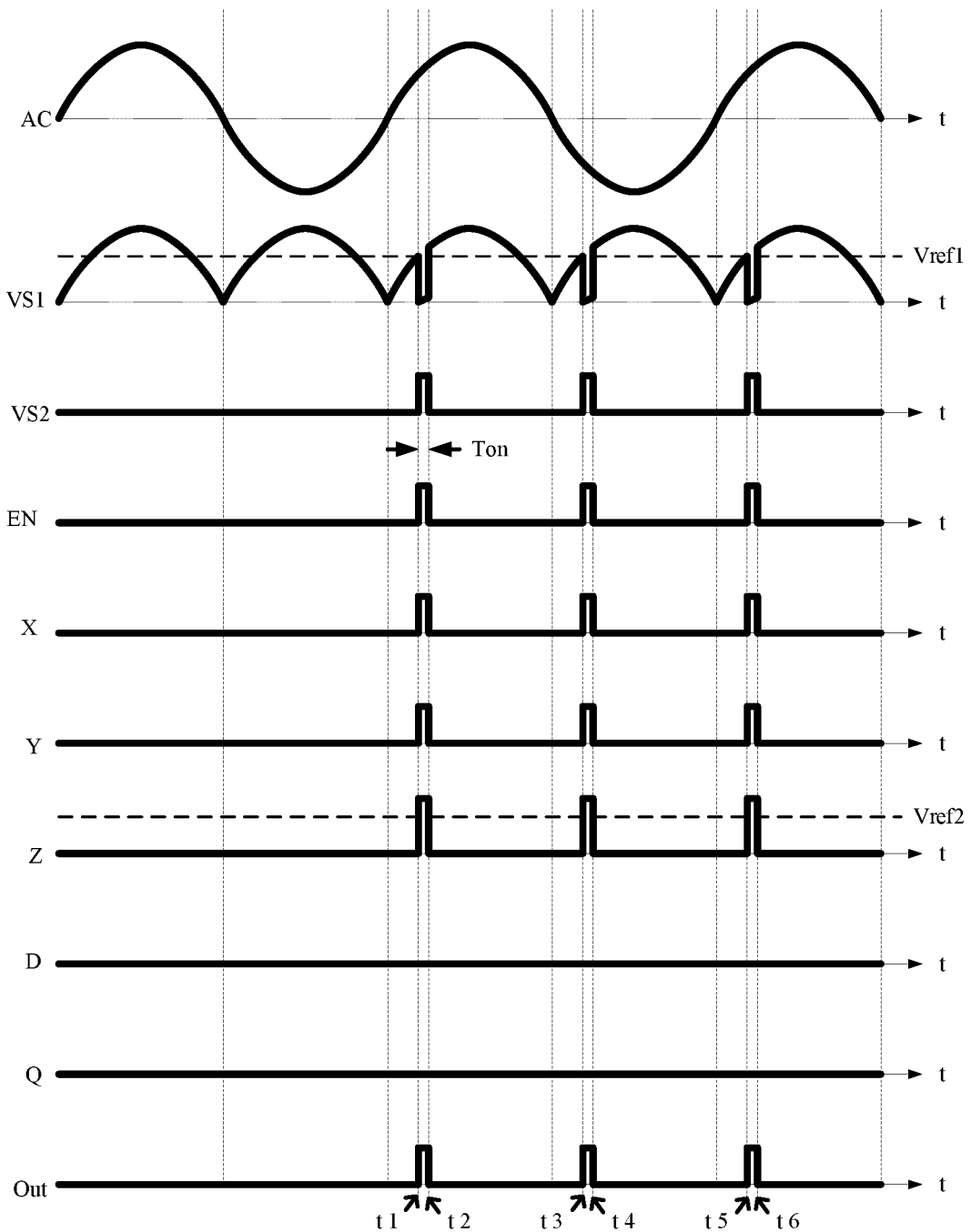
FIG. 12 schematically illustrates a control timing diagram of an AC power supply system in an abnormal state.

FIG. 12 schematically illustrates a control timing diagram of an AC power supply system in an abnormal state. Referring to FIGS. 11 and 12, timing variation of output signals of components in the control circuit when the AC power supply system is abnormal is described below.

Referring to FIG. 12, at a time point t1, VS1=Vref1. An effective level output by the first comparator 110 activates the monostable timer to output a high-level signal. Duration of the high-level signal is shown in FIG. 12 as Ton, i.e., a period from the time point t1 to a time point t2.

The high-level signal output by the monostable timer passes through the OR logic gate 103a to make the output Out of the driving buffer 103b be a high level, so that the first switch K1 becomes conductive. Further, the high-level signal output from the monostable timer enables the enabling signal EN to be effective, and the duration when the function enabling signal EN retains effective is the period Ton. At a rising edge of the function enabling signal EN (i.e., the time point t1), the voltage signal acquisition circuit 112 samples, records and holds the current signal VS1 as the signal X. During a period when the function enabling signal EN is effective, the current signal acquisition circuit 113 operates normally, so that the current sampling signal VS2 generated during the duration when the first switch K1 is conductive is input as the signal Y. The signal X is divided by the signal Y to obtain the signal Z. The amplitude of the signal Z reflects the magnitude of the power supply equivalent impedance R in the current AC power supply system.

When the amplitude of the signal Z exceeds the second reference voltage Vref2, the second comparator 111 outputs the signal D at a low level. Therefore, the trigger logic register 102c cannot be effectively triggered, and outputs a signal Q at a low level as in an initial state.

When the time point t2 comes, the output of the monostable timer turns to be a low level again, which makes the function enabling signal EN be ineffective to disable the voltage signal acquisition circuit 112, the current signal acquisition circuit 113, the arithmetic circuit 114 and the second comparator 111. This causes the signals X, Y, Z and D to be reset to a low level. Further, the output of the monostable timer becomes a low level at the time point t2, and passes through the OR logic gate 103a to cause the output Out of the driving buffer 103b to be a low level as well, so that the first switch K1 is controlled to be non-conductive.

A time period from the time point t1 to the time point t2 is a first conductive duration of the first switch K1 enabled by the state monitoring circuit. Following time periods from the time point t3 to the time point t4 and from the time point t5 to the time point t6 are second and third conductive durations of the first switch K1 enabled by the state monitoring circuit. If the power supply equivalent impedance of the AC power supply system retains a relatively great value, the state monitoring circuit may continue operating, and determine that the AC power supply system is abnormal all the time, which prevents the power converter stage from operating to eliminate potential safety hazard.

Figure 13:
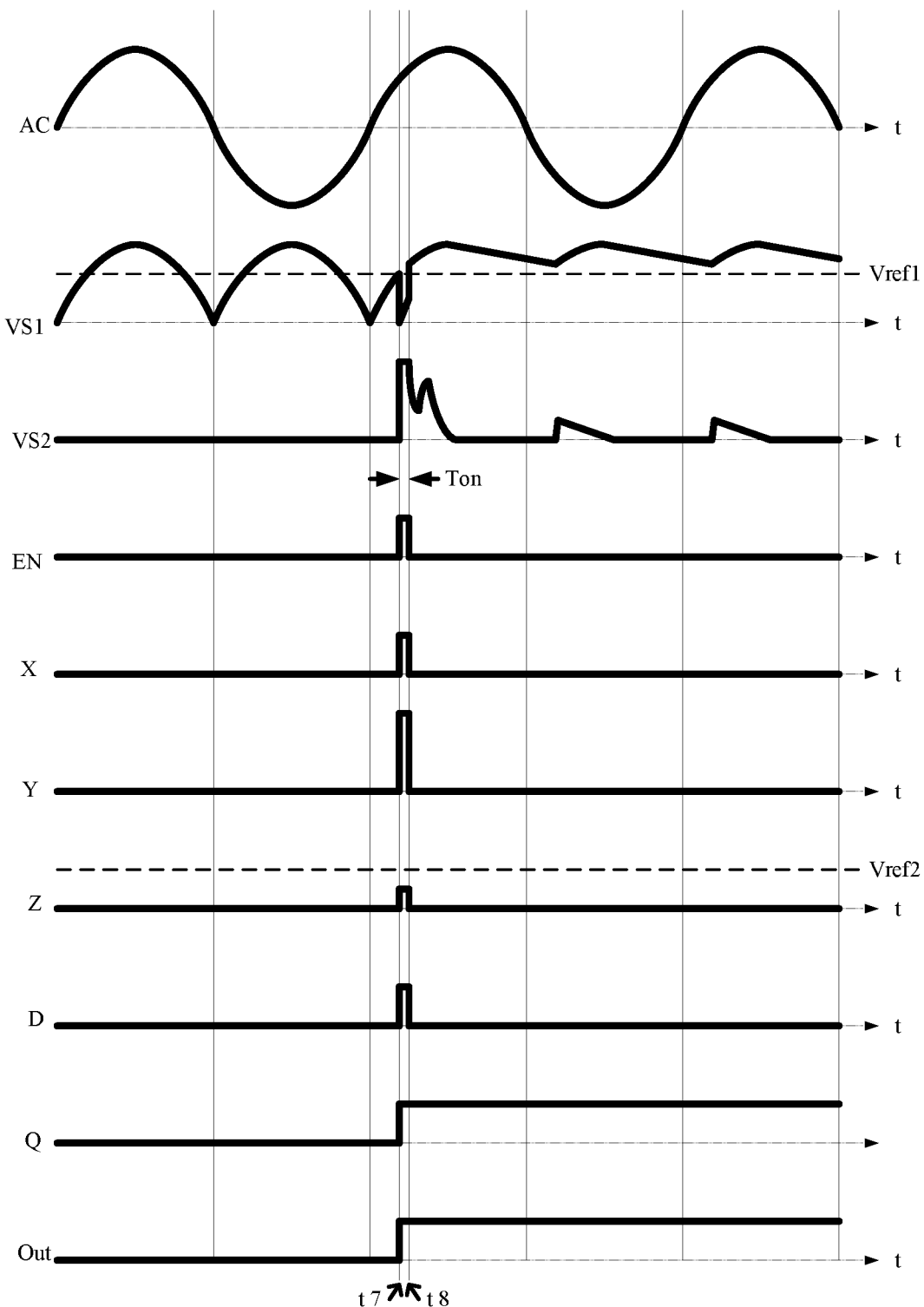
FIG. 13 schematically illustrates a control timing diagram of an AC power supply system in a normal state.

FIG. 13 schematically illustrates a control timing diagram of an AC power supply system in a normal state. Referring to FIGS. 11 to 13, timing variation of output signals of components in the control circuit when the AC power supply system is normal is described below.

Referring to FIG. 13, at a time point t7, VS1=Vref1. The first comparator 110 activates the monostable timer to output a high-level signal, and duration of the high-level signal is Ton, i.e., a period from the time point t7 to a time point t8. The high-level signal output from the monostable timer passes through the OR logic gate 103a to make the output Out of the driving buffer 103b be a high level, so as to control the first switch K1 to be conductive. Further, the high-level signal output from the monostable timer enables the function enabling signal EN to be valid effective, and duration when the function enabling signal EN is effective is the time period. Ton. At the rising edge (i.e., at the time point t7) of the function enabling signal EN, the voltage signal acquisition circuit 112 samples, records and holds the current signal VS1 as the signal X. During the duration when the function enabling signal EN is effective, the current signal acquisition circuit 113 operates normally, so that the current sampling signal VS2 generated during the duration when the first switch K1 is conductive is input as the signal Y. The signal X is divided by the signal Y to obtain the signal Z. The amplitude of the signal Z reflects the magnitude of the power supply equivalent impedance R in the current AC power supply system.

When the amplitude of the signal Z is lower than Vref2, the state monitoring circuit determines that the power supply equivalent impedance of the AC power supply system is a normally small value. Therefore, the second comparator 111 outputs the signal D at a high level, to trigger the trigger logic register 102c effectively. In this way, the signal D output from the trigger logic register 102c is a high level. Even if the period Ton defined by the monostable timer ends, a high-level output state of the trigger logic register 102c may not be changed. The high-level signal Q passes through the inverter gate 115 and the AND logic gate 116 to disable the function enabling signal EN.

The signal Q which always retains a high level is supplied to the driving buffer 103b via the OR logic gate 103a, so that the output Out of the driving buffer 103b is always at a high level. In this way, the first switch K1 always keeps conductive, and afterward, the power converter stage starts operating continuously.

In some embodiments, as admittance and impedance are reciprocal to each other, the admittance can also reflect whether the current state of the AC power supply system is normal. Therefore, in some embodiments, the current state information monitored by the monitoring circuitry may be total equivalent admittance of the AC power supply system.

Specifically, the monitoring result calculation circuit 102a may calculate an estimated value of the total equivalent admittance of the AC power supply system, and the monitoring result comparison circuit 102b may compare the estimated value with the second reference voltage Vref2, and output a determination signal which indicates the current state of the AC power supply system. The logic register 102c determines whether to trigger the switching circuit to enter a continuous conduction state based on the determination signal.

Figure 14:
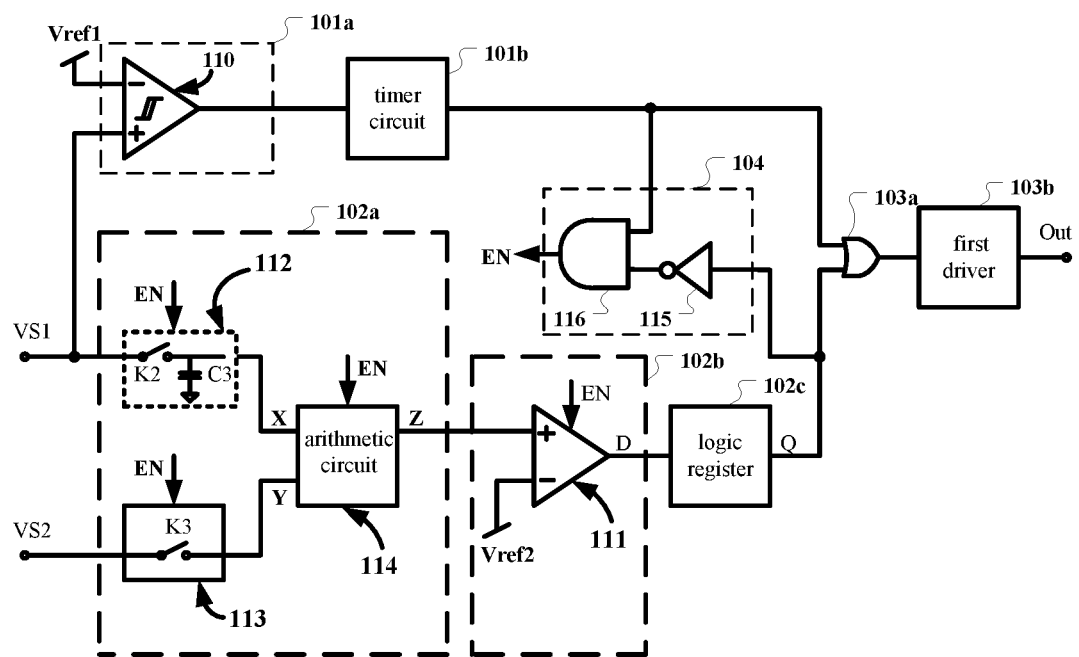
FIG. 14 schematically illustrates a circuit structural diagram of a control circuit according to another embodiment of the present disclosure.

The impedance of a normal AC power supply system is generally small, and the admittance should be great accordingly; and the impedance of an abnormal AC power supply system is generally great, and the admittance should be small accordingly. Therefore, when the monitoring result comparing circuit 102b is the second comparator 111, input polarity of the second comparator 111 needs to be adjusted accordingly. That is, the estimated value obtained by the arithmetic circuit 114 is sent to a positive input terminal of the second comparator 111, and the second reference voltage Vref2 is sent to a negative input terminal of the second comparator 111. Details can be referred to FIG. 14.

Figure 15:
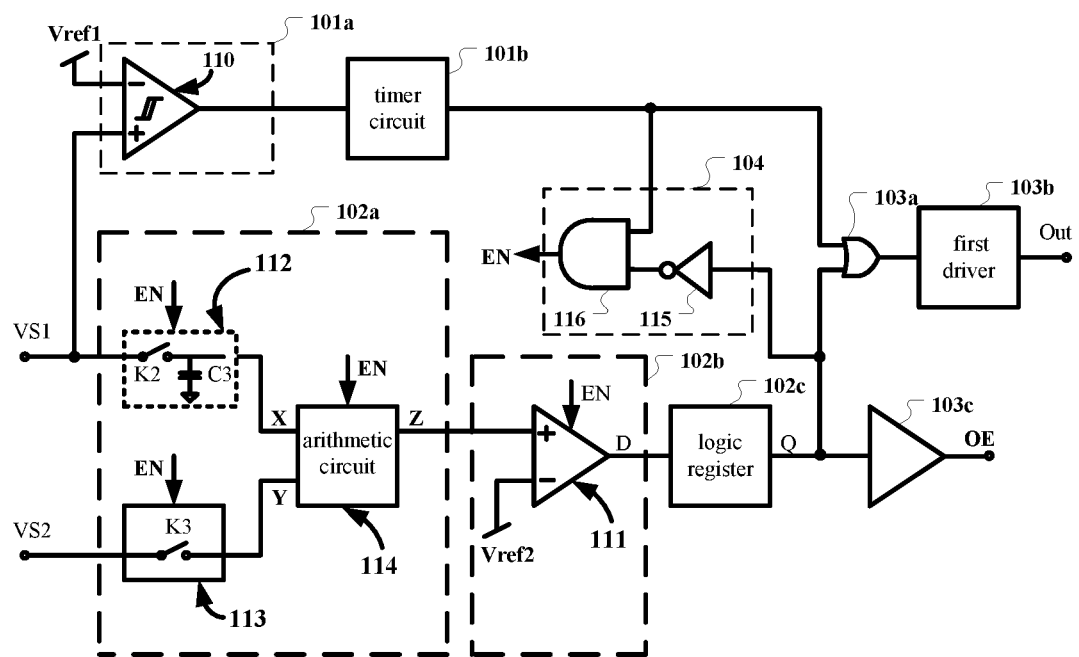
FIG. 15 schematically illustrates a circuit structural diagram of a control circuit according to another embodiment of the present disclosure.

FIG. 15 schematically illustrates a circuit structural diagram of a control circuit according to another embodiment. Referring to FIG. 15, a difference between the control circuit in FIG. 15 and that in FIG. 11 lies in that: the control circuit includes an enabling signal output terminal OE.

Specifically, the driver circuit may further include a second driver 103c. The output signal Q of the trigger logic register 102c outputs the enabling signal OE via the second driver 103c.

In some embodiments, if driving capability of the output signal Q of the trigger logic register 102c is enough for controlling the power converter stage, the driver circuit 103 may not include the second driver 103c, and the output signal Q of the trigger logic register 102c serves as the enabling signal OE.

Referring to FIG. 5, a power consumption equipment 51 is provided in an embodiment. The power consumption equipment 51 may include: a rectifier circuit 511 configured to rectify an AC voltage of an AC power supply into a DC voltage; a power converter stage 512 coupled with the rectifier circuit 511, and configured to perform power conversion based on the DC voltage; and the above state monitoring circuit 30 coupled between the rectifier circuit 511 and the power converter stage 512, and configured to identify a current state of the AC power supply system, and to determine whether to enable the AC power supply to deliver electrical energy to the power consumption equipment.

More information of the state monitoring circuit 30 can be derived in the above descriptions, and are not described in detail herein.

In an embodiment, an AC power supply system is provided, including: an AC supplying apparatus; and an electrical consumption apparatus, coupled with the AC supplying apparatus, where the electrical consumption apparatus includes a power consumption equipment, the electrical supplying facilities and the above state monitoring circuit 30.

In one embodiment, referring to FIG. 4, the state monitoring circuit 30 is coupled between the power consumption equipment 41 and the electrical power facilities in the AC power supply system.

In one embodiment, referring to FIG. 5, the power consumption equipment 51 may include a rectifier circuit 511 and a power converter stage 512. The state monitoring circuit 30 is coupled between the rectifier circuit 511 and the power converter stage 512.

From above, the state monitoring circuit 30 provided in the embodiments of the present disclosure can monitor total equivalent impedance or total equivalent admittance of the AC power supply system, and further determine whether to control the power consumption equipment to operate. In this way, potential safety hazard, such as a high-temperature melt or a fire caused by too great equivalent impedance of electrical power facilities, may be avoided.

In addition, compared with the existing techniques, the state monitoring circuit 30 provided in the embodiments of the present disclosure may identify the current state of the AC power supply system more accurately based on measurement of electrical parameters, judgment and switching operations without depending on uncertain factors of the electrical power facilities, such as insulated materials, conductive materials, mechanical contacts or aging characteristic. Therefore, more stable and reliable protection can be achieved.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A state monitoring circuit for an alternating current (AC) power supply system, comprising:
   a monitoring circuitry, configured to monitor present state information of the AC power supply system; and
   a control circuitry, coupled with the monitoring circuitry and configured to identify a present state of the AC power supply system based on the present state information monitored by the monitoring circuitry, and to determine whether to enable an AC power supply to deliver electrical energy to a power consumption equipment,
   wherein the monitored present state information of the AC power supply system comprises: a total equivalent impedance or a total equivalent admittance of the AC power supply system, wherein the total equivalent impedance is a sum of an equivalent impedance of all electrical supplying facilities in the AC power supply system, and the total equivalent admittance is a sum of an equivalent admittance of all the electrical supplying facilities in the AC power supply system, wherein all the electrical supplying facilities comprise a substation or a power transmitter, a power supply cable, an AC distribution box at a user side, a power cable at the user side, an AC power outlet at the user side and a power switch,
   wherein the power consumption equipment comprises: a rectifier circuit, configured to rectify an AC voltage from the AC power supply into a direct current (DC)

voltage; and a power converter stage, coupled with the rectifier circuit, and configured to perform a power conversion based on the DC voltage from the rectifier circuit, wherein the state monitoring circuit is coupled between the rectifier circuit and the power converter stage, wherein the control circuitry comprises: a control circuit, configured to identify the present state of the AC power supply system based on the present state information monitored by the monitoring circuitry, and output a corresponding control signal; a switching circuit, coupled with the control circuit, and configured to receive the corresponding control signal from the control circuit and operate in a conductive or a non-conductive state, so as to deliver or cut-off electrical energy from the AC power supply to the power consumption equipment and a charging and discharging circuit, connected in series with the switching circuit and coupled with the rectifier circuit, and configured to perform charging when the switching circuit is conductive, and perform discharging when the switching circuit is non-conductive, wherein the monitoring circuitry comprises: a first monitoring sub-circuit, coupled with the rectifier circuit, and configured to monitor a voltage value of the electrical supplying facilities in the AC power supply system in a duration when the switching circuit is conductive; and a second monitoring sub-circuit, coupled with the switching circuit, and configured to monitor a current following through the electrical supplying facilities in the AC power supply system.

2. The state monitoring circuit according to claim 1, wherein the first monitoring sub-circuit comprises:
a first sampling resistor, coupled with a positive output terminal of the rectifier circuit; and
a second sampling resistor, wherein a first terminal of the second sampling resistor is connected in series with the first sampling resistor, and is coupled with a first input terminal of the control circuit, and a second terminal of the second sampling resistor is coupled with a negative output terminal of the rectifier circuit.

3. The state monitoring circuit according to claim 1, wherein the first monitoring sub-circuit comprises:
a third sampling resistor, coupled with an output terminal of the charging and discharging circuit; and
a fourth sampling resistor, wherein a first terminal of the fourth sampling resistor is connected in series with the third sampling resistor, and is coupled with a first input terminal of the control circuit, and a second terminal of the fourth sampling resistor is coupled with a negative output terminal of the rectifier circuit.

4. The state monitoring circuit according to claim 1, wherein the first monitoring sub-circuit comprises:
a fifth sampling resistor, coupled with a first input terminal of the rectifier circuit; and
a sixth sampling resistor, wherein a first terminal of the sixth sampling resistor is connected in series with the fifth sampling resistor, and is coupled with a first input terminal of the control circuit, and a second terminal of the sixth sampling resistor is coupled with a negative output terminal of the rectifier circuit.

5. The state monitoring circuit according to claim 1, wherein the second monitoring sub-circuit comprises:
a seventh sampling resistor, wherein a first terminal of the seventh sampling resistor is connected in series with the switching circuit, and is coupled with a second input terminal of the control circuit, and a second terminal of the seventh sampling resistor is coupled with a negative output terminal of the rectifier circuit.

6. The state monitoring circuit according to claim 1, wherein the control circuit comprises:
a synchronization detecting circuit, coupled with the first monitoring sub-circuit and a first reference voltage output terminal, and configured to: when the voltage value monitored by the first monitoring sub-circuit is equal to a first reference voltage value output from the first reference voltage output terminal, output a corresponding signal to control the switching circuit to be conductive within a preset duration;
a state judgment circuit, coupled with the first monitoring sub-circuit and the second monitoring sub-circuit, and configured to: during the preset duration when the switching circuit is conductive, determine the present state of the AC power supply system based on monitoring results of the first monitoring sub-circuit and the second monitoring sub-circuit, and output a control signal corresponding to a determination result; and
a driver circuit, coupled with the synchronization detecting circuit and the state judgment circuit, and configured to: receive signals from the synchronization detecting circuit and the state judgment circuit, and control the switching circuit to be conductive or non-conductive.

7. The state monitoring circuit according to claim 6, wherein the synchronization detecting circuit comprises:
a synchronization detecting sub-circuit, coupled with the first monitoring sub-circuit and the first reference voltage output terminal, and configured to: when the voltage value monitored by the first monitoring sub-circuit is equal to the first reference voltage value output from the first reference voltage output terminal, output a startup signal; and
a timer circuit, coupled with the synchronization detecting sub-circuit, and configured to: when receiving the startup signal from the synchronization detecting sub-circuit, output a first control signal to control the switching circuit to be conductive within the preset duration, and output a second control signal to control the switching circuit to be non-conductive when the preset duration ends.

8. The state monitoring circuit according to claim 7, wherein the timer circuit is a monostable timer.

9. The state monitoring circuit according to claim 7, wherein the state judgment circuit comprises:
a monitoring result calculation circuit, coupled with the first monitoring sub-circuit and the second monitoring sub-circuit, and configured to: calculate an estimated value which indicates the present state information of the AC power supply system based on the monitoring results of the first monitoring sub-circuit and the second monitoring sub-circuit during the preset duration when the switching circuit is conductive;
a monitoring result comparison circuit, coupled with the monitoring result calculation circuit and a second reference voltage output terminal, and configured to: compare the estimated value calculated by the monitoring result calculation circuit with a second reference voltage value output from the second reference voltage output terminal, and output a determination signal which indicates the present state of the AC power supply system; and
a logic register, coupled with the monitoring result comparison circuit, and configured to: receive the determination signal from the monitoring result comparison circuit and determine whether to control the switching circuit to enter into a continuous conductive state.

10. The state monitoring circuit according to claim 9, wherein the monitoring result calculation circuit comprises:
a voltage signal acquisition circuit, coupled with the first monitoring sub-circuit, and configured to acquire the voltage monitored by the first monitoring sub-circuit;
a current signal acquisition circuit, coupled with the second monitoring sub-circuit, and configured to acquire the current monitored by the second monitoring sub-circuit; and
an arithmetic circuit, coupled with the voltage signal acquisition circuit and the current signal acquisition circuit, and configured to receive the voltage from the voltage signal acquisition circuit and the current from the current signal acquisition circuit, and calculate the estimated value which indicates the present state information of the AC power supply system.

11. The state monitoring circuit according to claim 10, wherein the arithmetic circuit is configured to: calculate a ratio of the voltage monitored by the first monitoring sub-circuit to the current monitored by the second monitoring sub-circuit as the estimated value which indicates the present state of AC power supply system.

12. The state monitoring circuit according to claim 9, wherein the determination signal is presented as a first determination signal which indicates the present state of the AC power supply system is normal, if the estimated value is lower than or equal to the second reference voltage value; and
wherein the determination signal is presented as a second determination signal which indicates the present state of the AC power supply system is abnormal, if the estimated value is greater than the second reference voltage value.

13. The state monitoring circuit according to claim 12, wherein the driver circuit is configured to:
control the switching circuit to be conductive, when the synchronization detecting circuit outputs the first control signal, or the synchronization detecting circuit outputs the second control signal and the monitoring result comparison circuit outputs the first determination signal; and
control the switching circuit to be non-conductive when the synchronization detecting circuit outputs the second control signal and the monitoring result comparison circuit outputs the second determination signal.

14. The state monitoring circuit according to claim 13, wherein the driver circuit comprises:
an OR logic gate, wherein input terminals of the OR logic gate are respectively coupled with the synchronization detecting circuit and the state judgment circuit, an output terminal of the OR logic gate is coupled with the switching circuit, and the OR logic gate is configured to execute an OR logic operation to outputs of the synchronization detecting circuit and the state judgment circuit to obtain a logic result, and send the logic result to the switching circuit to control the switching circuit to be conductive or non-conductive.

15. The state monitoring circuit according to claim 14, wherein the driver circuit further comprises:
a driving buffer, configured to amplify a signal level of the logic result of the OR logic gate and output an amplified logic result to the switching circuit.

16. The state monitoring circuit according to claim 9, wherein the control circuit further comprises:

an enabling circuit, wherein an input terminal of the enabling circuit is coupled with output terminals of the timer circuit and the logic register, an output terminal of the enabling circuit is coupled with the monitoring result calculation circuit and the monitoring result comparison circuit, and the enabling circuit is configured to provide a function enabling signal to the monitoring result calculation circuit and the monitoring result comparison circuit.

17. The state monitoring circuit according to claim 16, wherein the enabling circuit comprises:
an inverter gate, coupled with an output terminal of the logic register; and
an AND logic gate, wherein one input terminal of the AND logic gate is coupled with an output terminal of the timer circuit, the other input terminal of the AND logic gate is coupled with an output terminal of the inverter gate, and an output terminal of the AND logic gate outputs the function enabling signal.

18. The state monitoring circuit according to claim 1, wherein the charging and discharging circuit comprises:
a first capacitor, wherein one terminal of the first capacitor is coupled with the rectifier circuit, the other terminal of the first capacitor is coupled with the switching circuit, the first capacitor is connected in parallel with the power converter stage of the power consumption equipment, and configured to perform charging through the switching circuit when the switching circuit is conductive, and to perform discharging through the power converter stage when the switching circuit is non-conductive.

19. The state monitoring circuit according to claim 1, wherein the state monitoring circuit is coupled between the power consumption equipment and the electrical supplying facilities in AC power supply system.

20. A power consumption equipment, comprising:
a rectifier circuit, configured to rectify an alternating current (AC) voltage of an AC power supply into a direct current (DC) voltage;
a power converter stage, coupled with the rectifier circuit, and configured to perform power conversion based on the DC voltage; and
the state monitoring circuit according to claim 1, coupled between the rectifier circuit and the power converter stage, and configured to identify the present state of the AC power supply system, and to determine whether to enable the AC power supply to deliver electrical energy to the power consumption equipment.

21. An alternating current (AC) power supply system, comprising:
an AC supplying apparatus; and
an electrical consumption apparatus, coupled with the AC supplying apparatus,
wherein the electrical consumption apparatus comprises:
a power consumption equipment, the electrical supplying facilities and the state monitoring circuit according to claim 1.

22. A state monitoring circuit for an alternating current (AC) power supply system, comprising:
a monitoring circuitry, configured to monitor present state information of the AC power supply system; and
a control circuitry, coupled with the monitoring circuitry and configured to identify a present state of the AC power supply system based on the present state information monitored by the monitoring circuitry, and to determine whether to enable an AC power supply to deliver electrical energy to a power consumption equipment, wherein the monitored present state information of the AC power supply system comprises: a total equivalent impedance or a total equivalent admittance of the AC power supply system, wherein the total equivalent impedance is a sum of an equivalent impedance of all electrical supplying facilities in the AC power supply system, and the total equivalent admittance is a sum of an equivalent admittance of all the electrical supplying facilities in the AC power supply system, wherein all the electrical supplying facilities comprise a substation or a power transmitter, a power supply cable, an AC distribution box at a user side, a power cable at the user side, an AC power outlet at the user side and a power switch, wherein the power consumption equipment comprises: a rectifier circuit, configured to rectify an AC voltage from the AC power supply into a direct current (DC) voltage; and a power converter stage, coupled with the rectifier circuit, and configured to perform a power conversion based on the DC voltage from the rectifier circuit, wherein the state monitoring circuit is coupled between the rectifier circuit and the power converter stage, wherein the control circuitry comprises: a control circuit, configured to identify the present state of the AC power supply system based on the present state information monitored by the monitoring circuitry, and output a corresponding control signal; a switching circuit, coupled with the control circuit, and configured to receive the corresponding control signal from the control circuit and operate in a conductive or a non-conductive state, so as to deliver or cut-off electrical energy from the AC power supply to the power consumption equipment and a charging and discharging circuit, connected in series with the switching circuit and coupled with the rectifier circuit, and configured to perform charging when the switching circuit is conductive, and perform discharging when the switching circuit is non-conductive, wherein the charging and discharging circuit comprises: a second capacitor; and a discharging resistor connected in parallel with the second capacitor, wherein one terminal of the second capacitor is coupled with the rectifier circuit, the other terminal of the second capacitor is coupled with the switching circuit, and the second capacitor is configured to perform charging through the switching circuit when the switching circuit is conductive, and perform discharging through the discharging resistor when the switching circuit is non-conductive.

23. The state monitoring circuit according to claim 22, wherein the control circuit further comprises:

an enabling signal output terminal, coupled with an input terminal of the power converter stage, and configured to control the power converter stage to be activated and enter into a normal operation status, based on the present state of the AC power supply system.

* * * * *